United States Patent
Fujimori et al.

(10) Patent No.: US 10,998,681 B2
(45) Date of Patent: May 4, 2021

(54) ELECTRONIC COMPONENT TO REDUCE NOISE CAUSED BY THE TIP END OF A MEMORY CARD

(71) Applicant: Sony Mobile Communications Inc., Tokyo (JP)

(72) Inventors: Kotaro Fujimori, Tokyo (JP); Yoshihiro Kato, Tokyo (JP); Yuko Yoshida, Tokyo (JP)

(73) Assignee: SONY MOBILE COMMUNICATIONS INC., Tokyo (JP)

( * ) Notice: Subject to any disclaimer, the term of this patent is extended or adjusted under 35 U.S.C. 154(b) by 0 days.

(21) Appl. No.: 16/495,834

(22) PCT Filed: Feb. 14, 2018

(86) PCT No.: PCT/JP2018/005040
§ 371 (c)(1),
(2) Date: Sep. 20, 2019

(87) PCT Pub. No.: WO2018/179942
PCT Pub. Date: Oct. 4, 2018

(65) Prior Publication Data
US 2020/0136320 A1 Apr. 30, 2020

(30) Foreign Application Priority Data
Mar. 28, 2017 (JP) .............................. JP2017-062759

(51) Int. Cl.
*H01R 13/6594* (2011.01)
*G06K 7/00* (2006.01)
(Continued)

(52) U.S. Cl.
CPC ....... *H01R 13/6594* (2013.01); *G06K 7/0021* (2013.01); *H01R 13/6485* (2013.01);
(Continued)

(58) Field of Classification Search
CPC ...... G06K 7/0021; H05K 1/18; H05K 5/0026; H05K 5/0286; H05K 2201/10189;
(Continued)

(56) References Cited

U.S. PATENT DOCUMENTS

| 6,390,850 B2 * | 5/2002 | Yoshimura | H01R 13/2442 439/607.22 |
| 6,626,685 B2 * | 9/2003 | Toda | H01R 13/639 439/328 |

(Continued)

FOREIGN PATENT DOCUMENTS

| CN | 204330885 U | 5/2015 |
| JP | 2006-196355 A | 7/2006 |

(Continued)

OTHER PUBLICATIONS

International Search Report and Written Opinion dated Apr. 24, 2018 for PCT/JP2018/005040 filed on Feb. 14, 2018, 6 pages including English Translation of the International Search Report.

(Continued)

*Primary Examiner* — Travis S Chambers
(74) *Attorney, Agent, or Firm* — Xsensus LLP

(57) ABSTRACT

An electronic member provided in a circuit board having a connector. The connector has a card mounting port and holds a memory card in a state where a tip of the memory card is exposed from the card mounting port at a connection position where a connection terminal of the memory card and a connection terminal of the circuit board are connected. The electronic component includes a device that adds capacitance at a position separated from and facing at least a part of the tip of the memory card, in a state where the memory card is held at the connection position by the connector, and a connector having first and second end portions in which the first end portion is connected to the device that adds (Continued)

capacitance and the second end portion is connected to a ground of the circuit board.

11 Claims, 23 Drawing Sheets

(51) Int. Cl.
    *H01R 13/648*     (2006.01)
    *H05K 1/18*     (2006.01)
    *H05K 5/00*     (2006.01)
    *H05K 5/02*     (2006.01)

(52) U.S. Cl.
    CPC .............. *H05K 1/18* (2013.01); *H05K 5/0026* (2013.01); *H05K 5/0286* (2013.01); *H05K 2201/10189* (2013.01)

(58) Field of Classification Search
    CPC .............. H05K 5/0269; H01R 13/6593; H01R 13/6581; H01R 13/658; H01R 13/6585; H01R 13/6594; H01R 13/659; H01R 13/6596; H01R 13/6485; H01R 13/5213
    USPC ...... 439/62, 607.01, 607.05, 607.13, 607.14, 439/607.23, 607.25, 607.27, 607.29, 439/607.57, 607.22, 607.31, 607.33, 439/607.55
    See application file for complete search history.

(56) References Cited

U.S. PATENT DOCUMENTS

| | | | | |
|---|---|---|---|---|
| 6,666,720 B1* | 12/2003 | Reisinger | ........... | H01R 13/6594 |
| | | | | 439/607.13 |
| 6,918,773 B2* | 7/2005 | Chen | .................... | H05K 5/0273 |
| | | | | 439/64 |
| 7,491,089 B2* | 2/2009 | Lang | .................. | H01R 12/7005 |
| | | | | 439/358 |
| 7,641,515 B1* | 1/2010 | Szczesny | ........... | H01R 13/6582 |
| | | | | 439/607.01 |
| 8,553,387 B2* | 10/2013 | Wang | .................. | H05K 9/0067 |
| | | | | 361/212 |
| 8,747,160 B2* | 6/2014 | Wang | ...................... | G06F 1/182 |
| | | | | 439/607.31 |
| 2015/0099382 A1* | 4/2015 | Chang | .................... | H01R 27/02 |
| | | | | 439/152 |
| 2015/0207246 A1* | 7/2015 | Lewis | .................. | H01R 13/506 |
| | | | | 439/62 |
| 2016/0056581 A1 | 2/2016 | Kamikura et al. | | |

FOREIGN PATENT DOCUMENTS

| | | |
|---|---|---|
| JP | 2010-44926 A | 2/2010 |
| KR | 10-2016-0096438 A | 8/2016 |

OTHER PUBLICATIONS

Extended Search Report dated Jan. 22, 2020, issued in corresponding European Patent Application No. 18775278.7, 8 pages.

* cited by examiner

ELECTRONIC COMPONENT TO REDUCE NOISE CAUSED BY THE TIP END OF A MEMORY CARD

CROSS-REFERENCE TO RELATED APPLICATIONS

The present application is based on PCT filing PCT/JP2018/005040, filed Feb. 14, 2018, which claims priority to JP 2017-062759, filed Mar. 28, 2017, the entire contents of each are incorporated herein by reference.

TECHNICAL FIELD

The present disclosure relates to an electronic component.

BACKGROUND ART

Memory cards are used as auxiliary recording media for storing information in various devices. The memory cards are connected to the devices in a state of being held by connectors provided in the devices, at the time of use, for example.

Among the connectors, there is a card connector having a structure in which a part of the memory card is exposed from a card mounting port of the connector, as disclosed in Patent Document 1, for example, from the viewpoint of convenience of insertion and removal of the memory card.

CITATION LIST

Patent Document

Patent Document 1: Japanese Patent Application Laid-Open No. 2010-44926

SUMMARY OF THE INVENTION

Problems to be Solved by the Invention

However, an operation of an own device or an external device may be affected by emission or reception of noise related to electro-magnetic compatibility (EMC), due to the exposed portion of the card. Further, problems of deterioration (Desense) of reception sensitivity of an antenna due to the noise emitted from the card and circuit malfunction (RFI; Radio Frequency Interference) and electro-static discharge (ESD) due to the card receiving a transmission wave from the antenna or static electricity from a surrounding environment may be caused and these may affect the operation of the own device or the external device.

As a countermeasure against these problems, there is technology for reducing electro-magnetic interference (EMI) radiated from the memory card by providing a predetermined filter on a wiring electrically connecting a card controller and the connector. However, in this filter, it is possible to reduce an influence on an operation of the card controller. However, it is difficult to reduce EMI, Desense, or the like occurring due to the operation of the memory card. Further, it is also difficult to suppress EMS, RFI, ESD, and the like from occurring due to the exposed portion of the memory card.

Accordingly, an object of the present disclosure is to reduce noise caused by a memory card and to normally maintain an operation of the memory card while securing convenience of insertion and removal of the memory card.

Solutions to Problems

According to the present disclosure, there is provided an electronic member provided in a circuit board having a connector. The connector has a card mounting port and holds a memory card in a state where a tip of the memory card is exposed from the card mounting port at a connection position where a connection terminal of the memory card and a connection terminal of the circuit board are connected. The electronic component includes a capacitance addition unit provided at a position separated from and facing at least a part of the tip of the memory card, in a plan view with respect to at least one surface of the memory card, in a state where the memory card is held at the connection position by the connector, and a connection unit having first and second end portions in which the first end portion is connected to the capacitance addition unit and the second end portion is connected to a ground of the circuit board.

Effects of the Invention

As described above, according to the present disclosure, it is possible to reduce noise caused by a memory card and to normally maintain an operation of the memory card while securing convenience of insertion and removal of the memory card.

Further, the above effects are not necessarily restrictive, and in addition to or instead of the above effects, any effects shown in the present specification or other effects that can be grasped from the present specification may be achieved.

MODE FOR CARRYING OUT THE INVENTION

Figure 1:
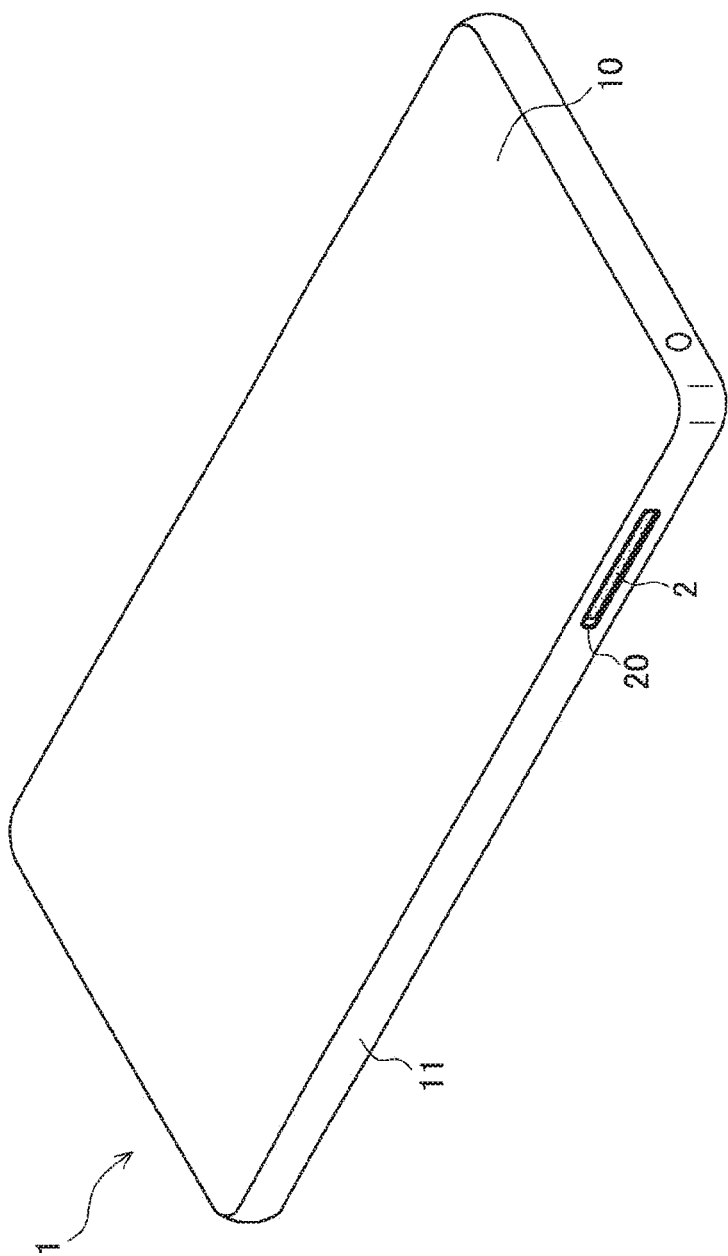
FIG. 1 is a diagram showing a schematic configuration of a portable terminal according to an embodiment of the present disclosure.

Hereinafter, preferred embodiments of the present disclosure will be described in detail with reference to the accompanying drawings. Further, in the present specification and the drawings, components having substantially the same functional configurations will be denoted by the same reference numerals and redundant descriptions will be omitted.

Further, the description will be made in the following order

1. Outline
2. First embodiment
2.1. Configuration example
2.2. Modification
3. Second embodiment
4. Summary

1. Outline

FIG. 1 is a diagram showing a schematic configuration of a portable terminal according to an embodiment of the present disclosure. As shown in FIG. 1, a portable terminal 1 has a casing 10. A groove 20 is provided in a part of a side portion 11 of the casing 10. The groove 20 is provided to be able to accommodate a memory card 2. A circuit board and a connector not shown in FIG. 1 are provided on an inner side of the casing 10 in the groove 20. The memory card 2 is held by the connector. In a state where the memory card 2 is held by the connector, a connection terminal of the circuit board and a connection terminal of the memory card 2 are electrically connected. With this arrangement, signals can be transmitted and received between the memory card 2 and a card controller (not shown in the drawings) provided in the circuit board. Then, for example, the portable terminal 1 can store information in the memory card 2 or obtain information from the memory card 2 via a control device not shown in the drawings.

Further, the portable terminal 1 is an example of a device using a memory card. Examples of the device includes an information device such as a personal computer (PC), a smart phone, a mobile phone, a tablet, a game machine, a scanner, and a printer, a video device such as a TV and a recorder, an imaging device such as a digital camera and a digital video camera, a household appliance, an audio device, and the like. Further, the device can include an interface device for electrically connecting the memory card to another device using the memory card, such as a reader, a writer, or an adapter of the memory card.

Further, in the present specification, the memory card is a card-type recording device on which a recording medium such as a flash memory and a hard disk is mounted and which can be electrically connected to another device via a connection terminal. A size and a type of the memory card are not particularly limited, and a known memory card is an application target of present technology. Further, the memory card is not limited to a function as the recording device. For example, a memory card such as a so-called subscriber identity module (SIM) card that has information regarding an ID of a user and has a function of enabling communication of the portable terminal 1 or a memory card that is used for the purpose of extending the function of portable terminal 1 or the like is also the application target of the present technology.

As shown in FIG. 1, in a state where the memory card 2 is held by the connector of the portable terminal 1, a tip of the memory card 2 is exposed to the outside from a card mounting port of the connector provided in the groove 20. In this configuration, the user of the portable terminal 1 can easily insert and remove the memory card 2 by pinching the tip of the memory card 2. Further, in order to facilitate the insertion and removal of the memory card 2, for example, a known push-type biasing mechanism or the like may be provided in the connector. Then, for example, in a case where the memory card 2 is held by the connector, the user of the portable terminal 1 can easily remove the memory card 2 by pushing the tip of the memory card 2 into the casing 10. Further, in a case where the memory card 2 is held by the connector, the user of the portable terminal 1 can easily fix the memory card 2 to the connector by pushing the memory card 2 into the casing 10.

Incidentally, at the time of the operation of the portable terminal 1, problems concerning EMC, Desense, RFI, and ESD may be caused due to the tip (that is, the exposed portion) of the memory card 2. For example, as the problem concerning EMC, a problem that the operation of another device or the portable terminal 1 is affected by radiation of noise (disturbance wave) from the tip of the memory card 2 to the outside (EMI: Electro-Magnetic Interference) or reception of external noise at the tip of the memory card 2 (EMS; Electro-Magnetic Susceptibility) can occur.

Further, as the problem concerning Desense, a problem that sensitivity of an antenna (not shown in the drawings) of the portable terminal 1 is deteriorated by receiving the electro-magnetic noise (disturbance wave) radiated from the tip of the memory card 2 by the antenna can occur. Further, as the problem concerning RFI, a problem that the operation of the portable terminal 1 (particularly, the memory card 2) is affected by receiving a transmission wave radiated from the antenna of the portable terminal 1 as the noise at the tip of the memory card 2 can occur.

Note that, in the present specification, the noise means an electro-magnetic wave or the like other than a desired reception signal. For example, an electro-magnetic wave in a reception band in transmission and reception of a signal of the antenna can also become the noise.

Further, as the problem concerning ESD, a problem that the memory card 2 or various devices of the portable terminal 1 are destroyed or malfunction occurs due to a discharge current of static electricity flowing to the tip of the memory card 2 can occur.

As a countermeasure against these problems, for example, there is technology for reducing electro-magnetic interference (EMI) radiated from the memory card by providing a predetermined filter on a wiring electrically connecting the card controller and the connector.

Figure 2:
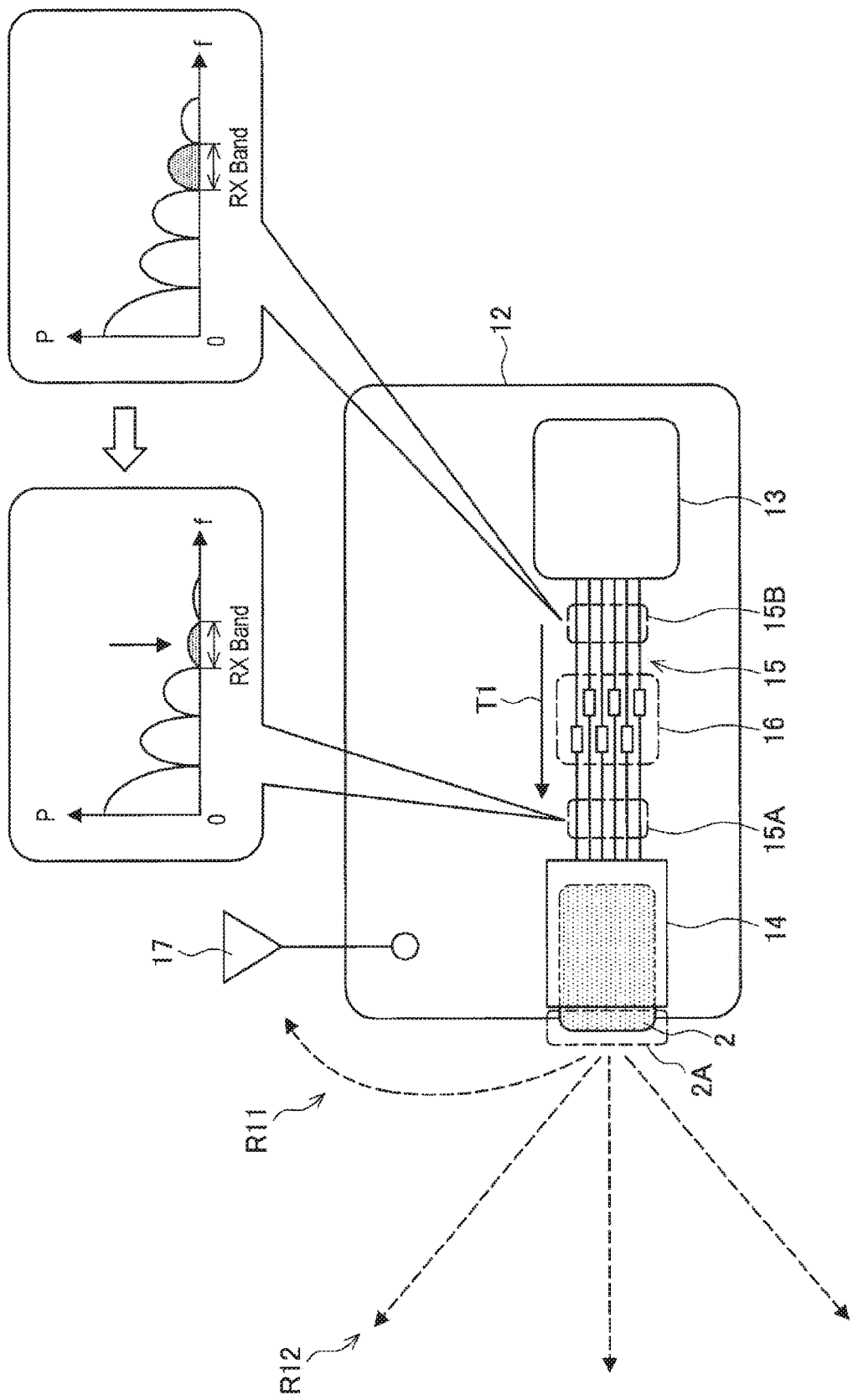
FIG. 2 is a schematic diagram showing an example of a function of a filter according to related technology.

FIG. 2 is a schematic view showing an example of a function of a filter according to related technology. FIG. 2 shows an example of a configuration of a circuit board 12 provided in a casing 10 of a portable terminal 1 according to the related technology. Referring to FIG. 2, the circuit board 12 includes a card controller 13 for controlling a memory card 2, a connector 14 for holding the memory card 2, a wiring 15 for electrically connecting the card controller 13 and the connector 14, a filter 16 provided on the wiring 15, and an antenna 17.

As shown in FIG. 2, in a case where a signal T1 is transmitted from the card controller 13 to the memory card 2, a high frequency component (Rx Band) may be included in the signal in a wiring 15B. By reducing or removing the high frequency component by the filter 16 (which can be realized by a low-pass filter, for example), in the wiring 15A after the signal passes through the filter 16, a signal in which the high frequency component has been reduced is transmitted to the memory card 2. Then, the strength of noise R11 from a tip 2A of the memory card 2 to the antenna 17 or noise R12 radiated to the outside is reduced. With this arrangement, it is possible to reduce an influence of EMI or Desense on the operation of the device.

Figure 3:
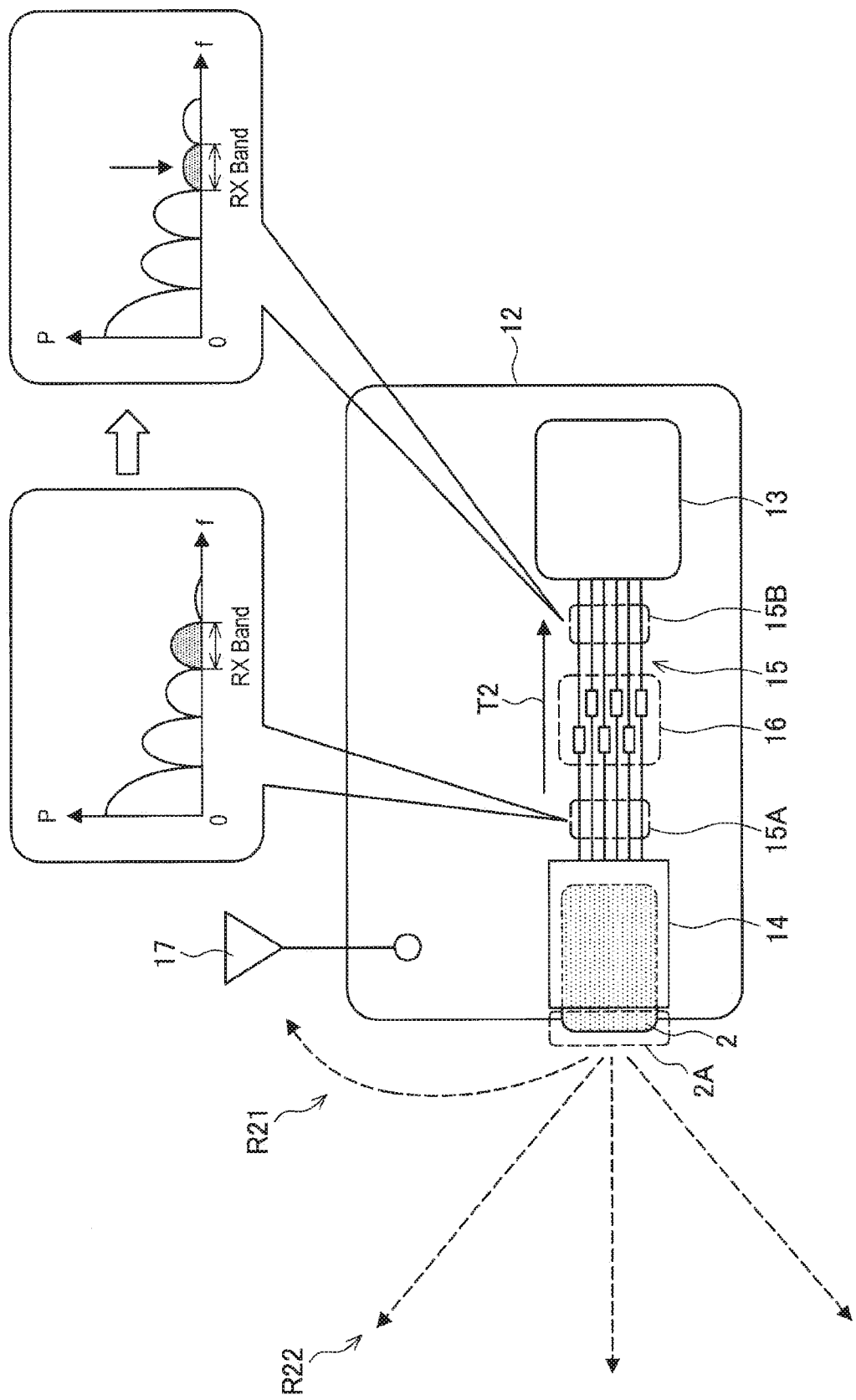
FIG. 3 is a schematic diagram showing an example of an influence of noise in related technology.
Figure 4:
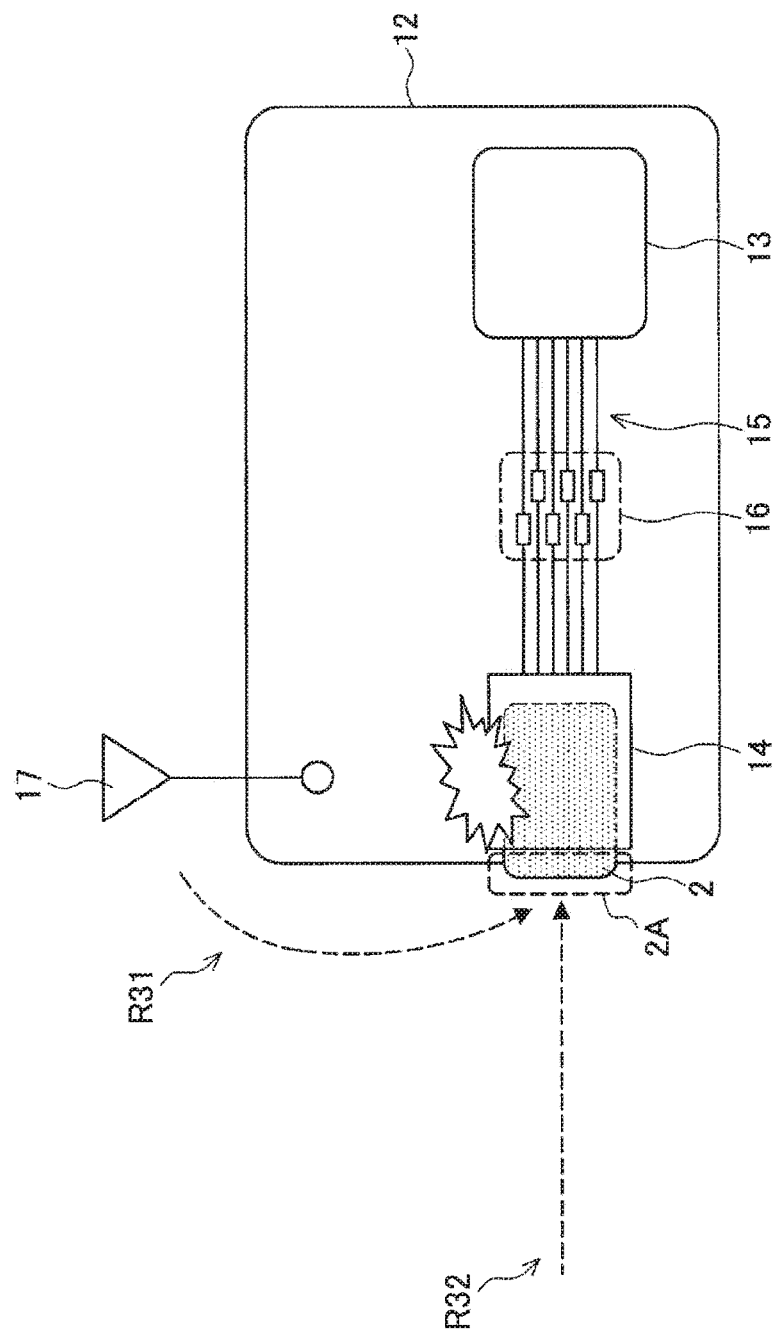
FIG. 4 is a schematic diagram showing an example of an influence of noise in related technology.
Figure 5:
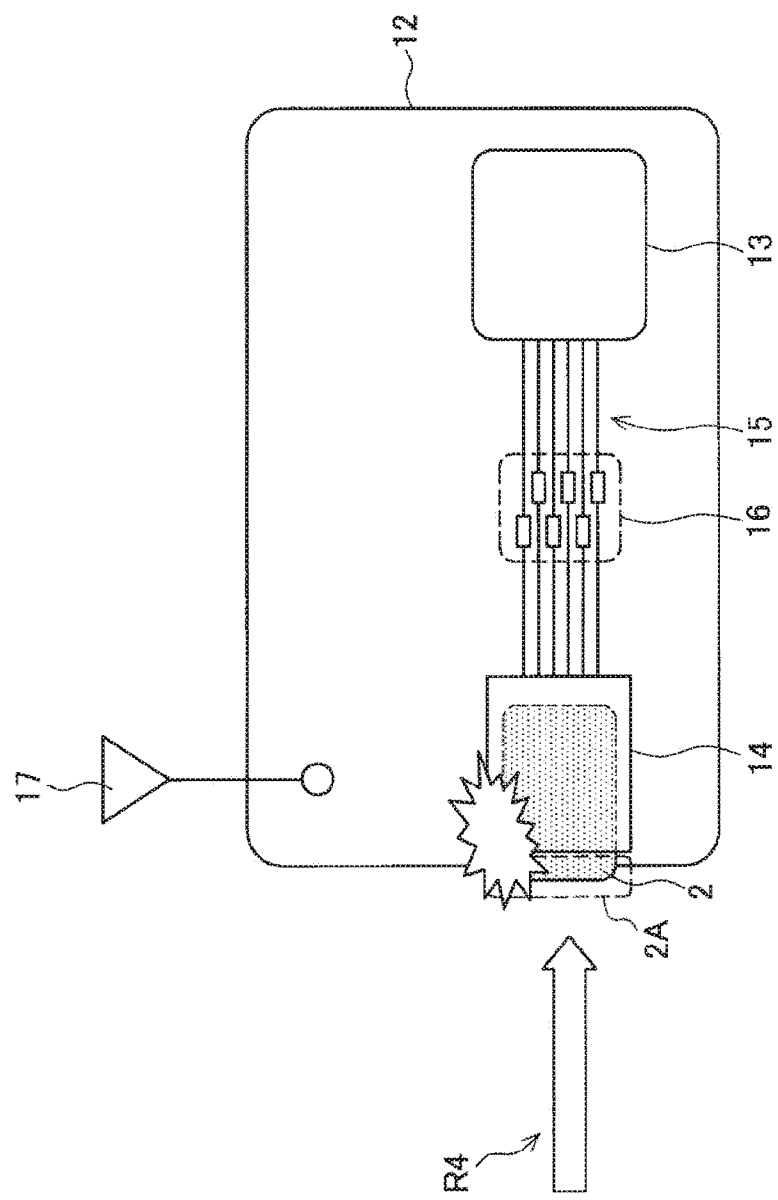
FIG. 5 is a schematic diagram showing an example of an influence of noise in related technology.

However, in this technology, it is difficult to reduce the noise and the like caused by the operation of the memory card 2. FIGS. 3 to 5 are schematic diagrams showing an example of an influence of noise in related technology. First, as shown in FIG. 3, in a case where a signal T2 is transmitted from the memory card 2 to the card controller 13, a high frequency component may be included in the signal in the wiring 15A. In this case, the high frequency component is reduced or removed by the filter 16, similar to the example shown in FIG. 2.

However, when the signal is transmitted from the memory card 2, a disturbance wave (noise) radiated from the tip 2A of the memory card 2 is not reduced or removed by the filter 16. Therefore, sensitivity of the antenna 17 may be reduced by noise R21 radiated from the tip 2A, and the operation of the external device may be affected by noise R22 radiated from the tip 2A.

Further, as shown in FIG. 4, there is a possibility that a transmission wave R31 radiated from the antenna 17 or noise R32 radiated from the external device is received by the memory card 2 at the tip 2A and affects the operation of the memory card 2. In this case, the filter 16 can reduce an influence of the noise received by the memory card 2 on the card controller 13. However, it is difficult to reduce an influence on the memory card 2.

Further, as shown in FIG. 5, in a case where electro-static discharge R4 occurs in the memory card 2, there is a possibility that the memory card 2 is electrostatically destroyed or the operation of the memory card 2 is affected by the electro-static discharge. In this case, the filter 16 can reduce an influence on the card controller 13 of the noise caused by the electro-static discharge R4 occurring in the memory card 2. However, it is difficult to reduce an influence on the memory card 2.

Further, for example, by providing the connector 14 or the like so that the memory card 2 is completely surrounded by the casing 10, it is possible to remove the influence of the noise or the like caused by the memory card 2. However, if the memory card 2 is completely surrounded by the casing 10, the convenience of insertion and removal of the memory card 2 may be lost.

Therefore, in an embodiment of the present disclosure, an electronic component is provided in the vicinity of the tip 2A of the memory card 2. The electronic component has a function of adding a floating capacitance (electric capacitance) in a virtual circuit configured by the circuit board 12 and the memory card 2 using a noise source as an electromotive force. With this arrangement, radiation resistance of the tip 2A of the memory card 2 is reduced. Therefore, the radiation of the noise occurring from the memory card 2 can be reduced, and the influence of the noise or the static electricity received by the memory card 2 on the memory card 2 can be reduced. As a result, it is possible to reduce the noise caused by the memory card and to normally maintain the operation of the memory card while securing the convenience of insertion and removal of the memory card.

2. First Embodiment

Hereinafter, a configuration and a function of an electronic component according to a first embodiment of the present disclosure will be described.

2.1. Configuration Example

Figure 6A:
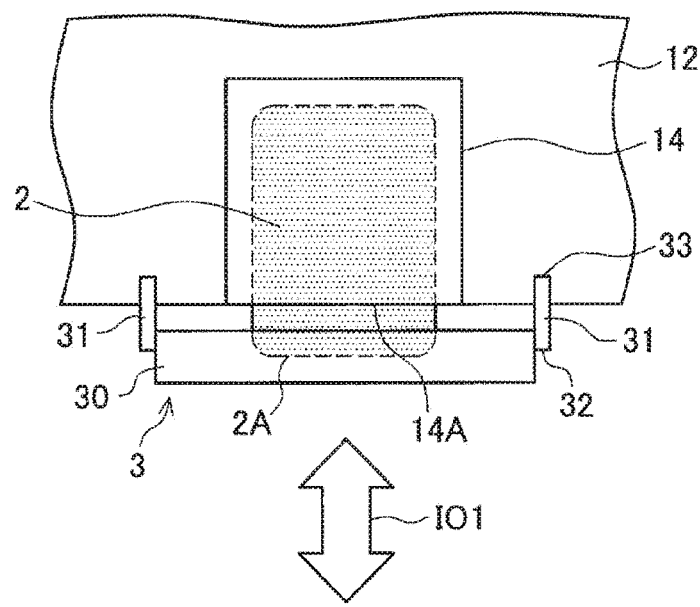
FIG. 6A is a top view showing a configuration example of a circuit board to which an electronic component according to a first embodiment of the present disclosure is attached.
Figure 6B:
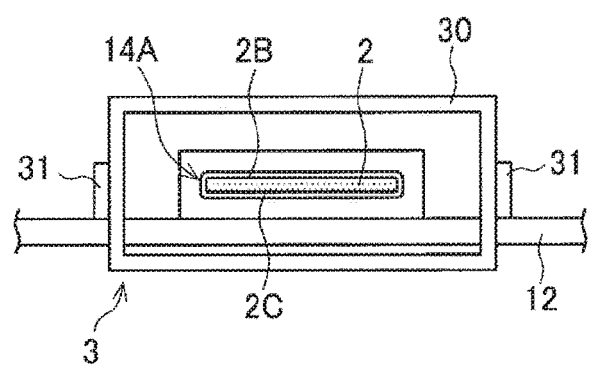
FIG. 6B is a front view showing a configuration example of a circuit board to which an electronic component according to the same embodiment is attached.

FIGS. 6A and 6B are respectively a top view and a front view showing a configuration example of a circuit board to which the electronic component according to the first embodiment of the present disclosure is attached. FIGS. 6A and 6B are diagrams showing a portion of a circuit board 12 provided in a casing 10 of a portable terminal 1, in which a connector 14 is provided.

Note that, in addition to the connector 14, the circuit board 12 is provided with a card controller that controls a memory card 2 and a wiring that electrically connects the card controller and the connector 14. Further, the circuit board 12 is appropriately provided with a circuit including a ground (GND). Further, the circuit board 12 may be further provided with a filter provided in the wiring and an antenna.

As shown in FIGS. 6A and 6B, the memory card 2 is in a state of being held by the connector 14. In this state, a connection terminal (not shown in the drawings) of the memory card 2 and a connection terminal (not shown in the drawings) of the circuit board 12 provided at an installation position of the connector 14 are connected. With this arrangement, the memory card 2 and the card controller 13 can communicate with each other. As such, the position of the memory card 2 where the connection terminal of the memory card 2 and the connection terminal of the circuit board 12 are connected is defined as a connection position.

At the connection position, the connector 14 can hold the memory card 2 in a state where a tip 2A of the memory card 2 is exposed from a card mounting port 14A. Here, the tip 2A of the memory card 2 means an end portion at the side opposite to the side located inside the connector 14. For example, as shown in FIG. 6A, in a case where the memory card 2 has a substantially rectangular shape, the tip 2A means a portion (for example, a side surface and a ridge portion) between left and right ends of the end portion at the side opposite to the side where the connection terminal of the memory card 2 is provided.

The memory card 2 can be inserted and removed along an insertion/removal direction IO1, with respect to the connector 14. That is, the tip 2A of the memory card 2 corresponds to an end portion in a direction where the memory card 2 is extracted, in the insertion/removal direction IO1.

Referring to FIGS. 6A and 6B, the electronic component 3 according to the present embodiment includes a capacitance addition unit 30 and a pair of connection units 31.

As shown in FIGS. 6A and 6B, the capacitance addition unit 30 is provided at a position separated from and facing the tip 2A of the memory card 2, on at least one side of a first surface (top surface) 2B or a second surface (bottom surface) 2C, in a state where the memory card 2 is held by the connector 14 at the connection position. Specifically, the capacitance addition unit 30 is provided at a position separated from and facing the tip 2A of the memory card 2, in a plan view with respect to the top surface 2B or the bottom surface 2C. Further, each of the first surface 2B and the second surface of the memory card 2 corresponds to one surface of the memory card.

More specifically, as shown in FIG. 6A, the capacitance addition unit 30 may be provided along the tip 2A, in a state where the memory card 2 is held at the connection position. In this case, as shown in FIG. 6A, the capacitance addition unit 30 is provided to cover the tip 2A in a cross-sectional view orthogonal to the surface of the memory card 2 (circuit board 12).

Further, as shown in FIG. 6B, the capacitance addition unit 30 may have a closed cross-sectional shape that surrounds the tip 2A in a cross-sectional view orthogonal to the insertion/removal direction 101 of the memory card 2 in the tip 2A. In this case, that is, the capacitance addition unit 30 is provided so as to surround the tip 2A of the memory card 2.

In addition, the capacitance addition unit 30 can be formed of a member including a conductor such as a metal. Although the details are described later, for example, the capacitance addition unit 30 may be formed of a metallic or metal-plated plate-like member or rod-like member, or may be formed of a part of a casing 10 formed of a conductor or a removable part.

The connection unit 31 is formed of a member including a conductor such as a metal, and has a first end portion 32 and a second end portion 33. In these end portions, the first end portion 32 is connected to the capacitance addition unit 30, and the second end portion 33 is connected to the ground provided on the top surface side of the circuit board 12. That is, the capacitance addition unit 30 is electrically connected to the ground of the circuit board 12 by the connection unit 31.

In the example shown in FIG. 6B, the pair of connection units 31 is connected to the side portions extending in a vertical direction from both ends of a width direction (direction orthogonal to the insertion/removal direction IO1) of the capacitance addition unit 30.

Further, in the examples shown in FIGS. 6A and 6B, the connection unit 31 has a rod shape, and a tip of the rod shape is connected as the first end portion 32 to the capacitance addition unit 30. However, the shape of the connection unit 31 and the position of the first end portion 32 are not particularly limited. Further, in the examples shown in FIGS. 6A and 6B, the first end portion 32 of the connection unit 31 is connected to a portion of the capacitance addition unit 30 which extends in a direction orthogonal to a board surface of the circuit board 12. However, the connection position with the first end portion 32 in the capacitance addition unit 30 is not particularly limited. Further, as long as the capacitance addition unit 30 and the first end portion 32 of the connection unit 31 are joined so as to be conductive, a joining aspect thereof is not particularly limited. For example, the capacitance addition unit 30 and the first end portion 32 may be mechanically fixed to each other like fitting, or may be fixed by a solder or an adhesive.

Similarly, in a case where the connection unit 31 has the rod shape, the end portion opposite to the tip is connected as the second end portion 33 to the ground of the circuit board 12. However, the position of the second end portion 33 is not particularly limited. That is, as long as the capacitance addition unit 30 and the ground of the circuit board 12 are electrically connected, the shape of the connection unit 31 and the position of each end portion are not limited. Further, the ground connected to the second end portion 33 of the connection unit 31 is not particularly limited, and any one of ground patterns formed on the circuit board 12 may be connected to the second end portion 33. Further, as long as the ground and the second end portion 33 are joined so as to be conductive, a joining aspect thereof is not particularly limited. For example, the ground and the second end portion 33 may be mechanically fixed to each other like fitting, or may be fixed by a solder or an adhesive. Further, the ground and the second end portion 33 may be removably provided. Further, the ground and the second end portion 33 may be electrically connected via another member such as a conductor.

The connection unit 31 electrically connects the capacitance addition unit 30 and the circuit board 12 as described above. Therefore, for example, at least a part of the connection unit 31 is formed of a conductor.

Further, in the examples shown in FIGS. 6A and 6B, the pair of connection units 31 is electrically connected via the capacitance addition unit 30. That is, a transmission path is provided outside the circuit board 12 by the capacitance addition unit 30 and the pair of connection units 31.

Figure 7A:
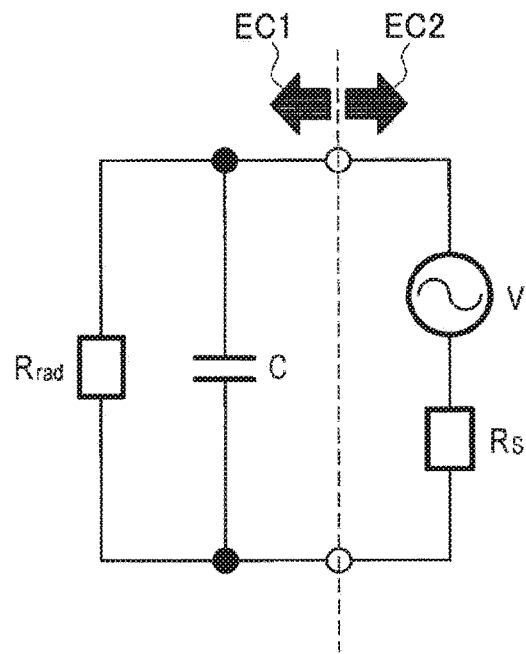
FIG. 7A is a diagram showing an example of a virtual equivalent circuit configured by an electronic component, a circuit board, and a memory card using a noise source as an electromotive force.
Figure 7B:
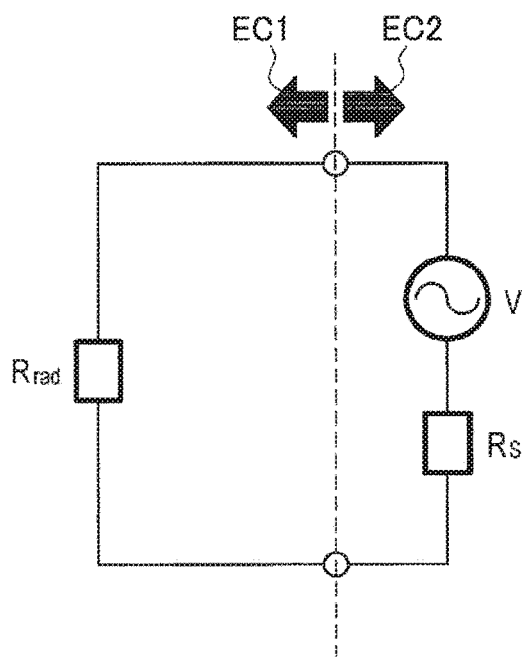
FIG. 7B is a diagram showing an example of a virtual equivalent circuit configured by a circuit board and a memory card using a noise source as an electromotive force.

Next, a function and an effect of the electronic component 3 according to the present embodiment will be described. FIG. 7A is a diagram showing an example of a virtual equivalent circuit configured by an electronic component, a circuit board, and a memory card using a noise source as an electromotive force. Further, FIG. 7B is a diagram showing an example of a virtual equivalent circuit configured by the circuit board 12 and the memory card 2 using a noise source as an electromotive force. A circuit represented by the equivalent circuit is also referred to as a noise propagation circuit.

FIG. 7A shows a configuration of the equivalent circuit including the electronic component 3 according to the present embodiment, and FIG. 7B shows a configuration of the equivalent circuit according to the related technology. In the equivalent circuits corresponding to the noise propagation circuits of FIGS. 7A and 7B, the side of an arrow EC1 indicates a circuit of the side of the memory card 2, and the side of an arrow EC2 indicates a circuit of the side of the circuit board 12. V indicates the noise source, $R_S$ indicates an internal resistance of the circuit board 12, and $R_{rad}$ indicates a radiation resistance of the memory card 2. For example, the strength of the noise radiated from the tip 2A of the memory card 2 is associated with consumed power in the radiation resistance $R_{rad}$.

Further, C indicates a floating capacitance added to a space between the capacitance addition unit 30 and the tip 2A of the memory card 2. That is, the capacitance addition unit 30 is provided so as to be connected to the ground of the circuit board 12 and face the tip 2A of the memory card 2, so that a capacitance component in the noise propagation circuit can be added.

First, referring to FIG. 7B, consumed power $P_{rad}$ in the radiation resistance $R_{rad}$ is represented by the following formula (1).

[Formula 1]

$$P_{rad} = \frac{R_{rad}}{(R_{rad} + R_S)^2} V^2 \quad (1)$$

On the other hand, referring to FIG. 7A, by adding the floating capacitance C, the consumed power $P_{rad}$ is represented by the following formula (2). Further, ω indicates an angular frequency of the equivalent circuit.

[Formula 2]

$$P_{rad} = \frac{R_{rad}}{(R_{rad} + R_S)^2 + R_S^2(\omega R_{rad} C)^2} V^2 \quad (2)$$

At this time, since the following formula (3) is satisfied, the consumed power $P_{rad}$ represented by the formula (2) is smaller than the consumed power $P_{rad}$ represented by the formula (1). Therefore, the strength of the noise radiated at the tip 2A of the memory card 2 is reduced.

[Formula 3]

$$R_S^2(\omega R_{rad} C)^2 \geq 0 \quad (3)$$

As described above, the electronic component 3 is provided separately at a position facing the tip 2A at the connection position of the memory card 2, so that the capacitance in the noise propagation circuit is added. With this arrangement, the strength of the noise radiated at the tip 2A can be reduced. Therefore, it is possible to reduce the noise caused by the memory card with respect to an antenna of an external device or an own device.

Further, similarly, even in a case where the noise source caused by RFI, EMS, EDS, or the like exists at the side of the memory card 2, the consumed power in the memory card 2 can be reduced. Therefore, the electronic component 3 can contribute to normally maintaining an operation of the memory card 2.

Further, in the configurations of the capacitance addition unit 30 and the pair of connection units 31 shown in FIGS. 6A and 6B, the transmission path is configured outside the circuit board 12, as described above. In this case, the electronic component 3 can play a role of bypassing a current transmitted from the antenna or the like from the memory card 2, for example.

Figure 8A:
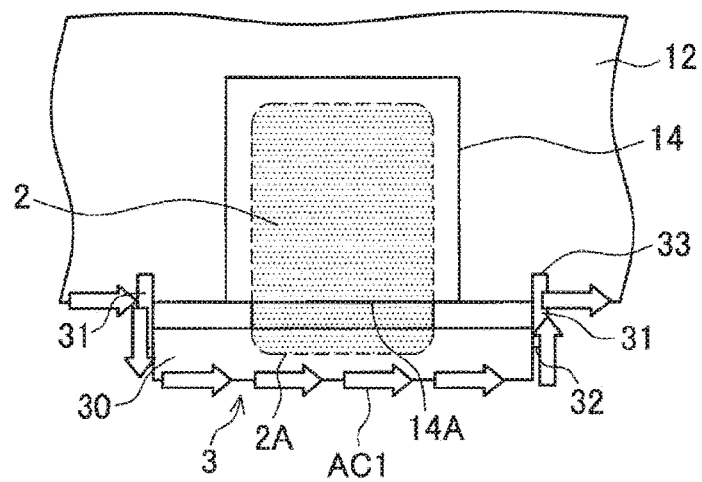
FIG. 8A is a top view showing an example of transmission of an antenna current in a circuit board to which an electronic component according to the same embodiment is attached.
Figure 8B:
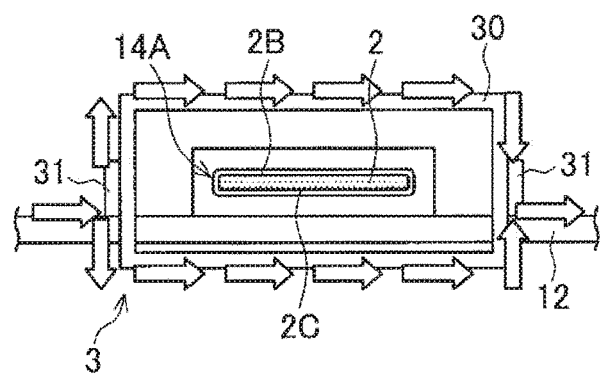
FIG. 8B is a front view showing an example of transmission of an antenna current in a circuit board to which the electronic component according to the same embodiment is attached.

FIGS. 8A and 8B are respectively a top view and a front view showing an example of transmission of an antenna current in the circuit board to which the electronic component according to the present embodiment is attached. Further, FIGS. 9A and 9B are respectively a top view and a front view showing an example of transmission of an antenna current in a circuit board according to related technology.

Figure 9A:
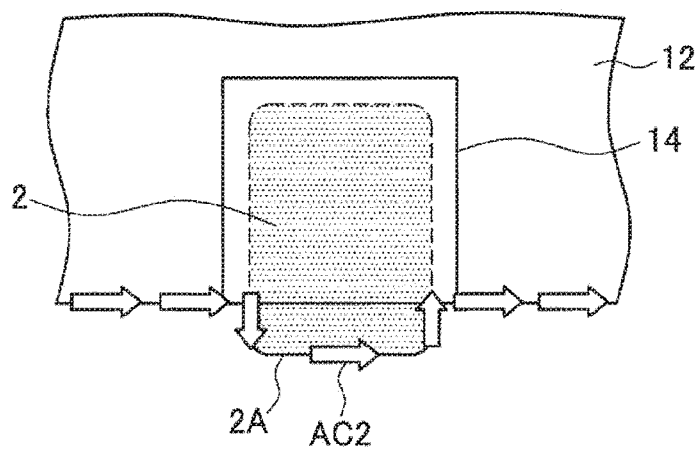
FIG. 9A is a top view showing an example of transmission of an antenna current in a circuit board according to related technology.
Figure 9B:
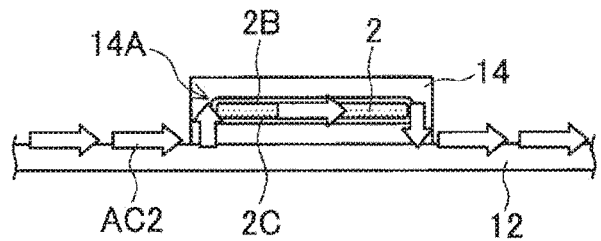
FIG. 9B is a front view showing an example of transmission of an antenna current in a circuit board according to related technology.

First, referring to FIGS. 9A and 9B, in a case where an antenna not shown in the drawings is provided in the portable terminal 1 including the circuit board 12, a part of the antenna current from the antenna may be transmitted to the end portion of the circuit board 12. At this time, as shown in FIGS. 9A and 9B, a current AC2 may pass through the tip 2A of the memory card 2. Then, since the noise occurring in the tip 2A is likely to propagate through the antenna, reception sensitivity of the antenna can be reduced.

On the other hand, referring to FIGS. 8A and 8B, in a case where the electronic component 3 is provided to configure the transmission path outside the circuit board 12 (that is, in a case where the pair of connection units 31 is electrically connected via the capacitance addition unit 30), a current AC1 to be a part of the antenna current can be bypassed by the electronic component 3. With this arrangement, isolation can be secured between the configuration for the memory card 2 and the configuration for the antenna. Therefore, an influence of the noise on the reception sensitivity of the antenna can be suppressed.

Further, in FIGS. 8A and 8B, it has been described that there is the function of bypassing the antenna current generated by the operation of the antenna. However, the present technology is not limited to this example. For example, the electronic component 3 can also play a role of bypassing a current that can be generated by an operation of other IC, module, or the like provided in the circuit board 12.

Figure 10:
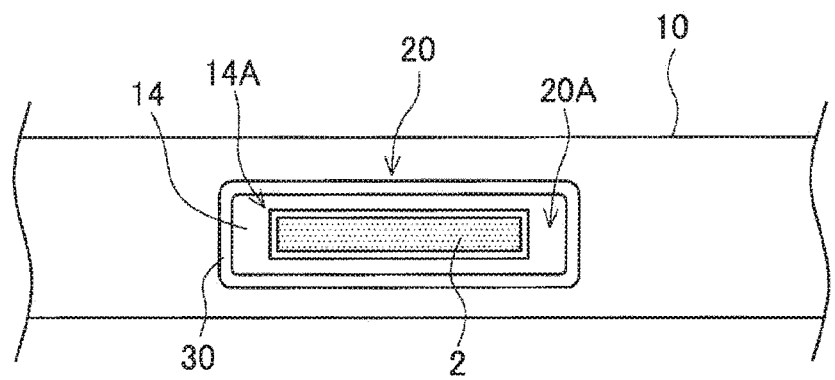
FIG. 10 is a partial front view showing an example of a portion provided with a groove in a casing according to the same embodiment.

Next, an installation example of the electronic component 3 in the casing 10 will be described. FIG. 10 is a partial front view showing an example of a portion provided with a groove in the casing according to the first embodiment of the present disclosure. As shown in FIG. 10, in the groove 20 provided in the side portion 11 of the casing 10, the connector 14 is provided so that the side of the card mounting port 14A of the connector 14 faces the outside. Further, the memory card 2 is inserted into the connector 14 through the card mounting port 14A, and the tip of the memory card 2 is exposed from the card mounting port 14A of the connector 14.

Here, as shown in FIG. 10, in a side view of the casing 10, an inner side surface 20A of the groove 20 is provided with the capacitance addition unit 30. That is, the capacitance addition unit 30 can be fixed to the groove 20 of the casing 10. Further, a connection unit not shown in the drawings is provided to be connected to the capacitance addition unit 30 and the ground of the circuit board 12 inside the casing 10. By this configuration, the capacitance addition unit 30 can be stably supported 2.2. Modification Next, configuration examples of electronic components according to modifications of the present embodiment will be described with reference to FIGS. 11A to 30.

First Modification

Figure 11A:
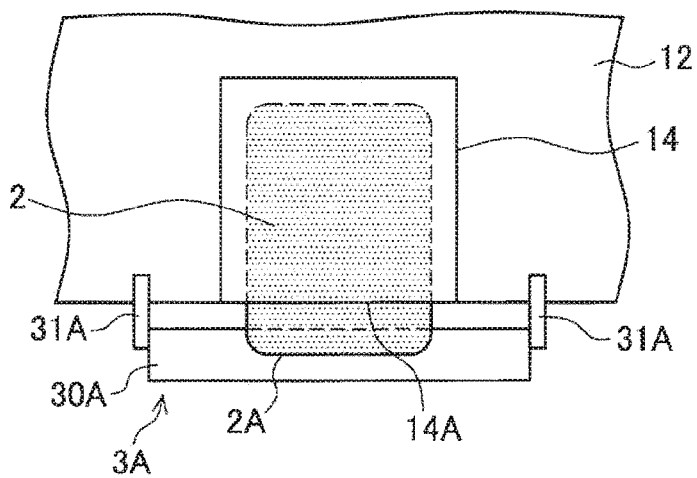
FIG. 11A is a top view showing a configuration example of a circuit board to which an electronic component according to a first modification of the same embodiment is attached.
Figure 11B:
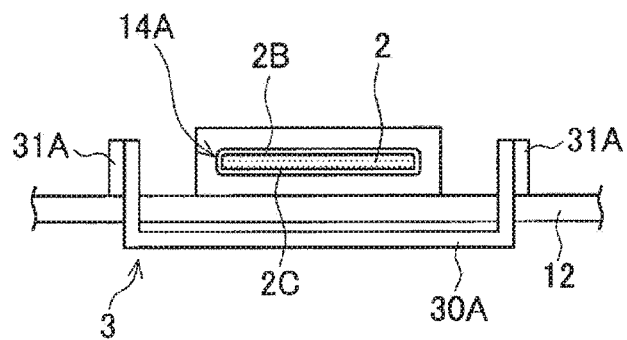
FIG. 11B is a front view showing a configuration example of a circuit board to which an electronic component according to the same modification is attached.

FIGS. 11A and 11B are respectively a top view and a front view showing a configuration example of a circuit board to which an electronic component according to a first modification of the present embodiment is attached. As shown in FIGS. 11A and 11B, a capacitance addition unit 30A configuring an electronic component 3A according to the present modification forms a U shape in a cross-sectional view orthogonal to an insertion/removal direction of a memory card 2. Further, the capacitance addition unit 30A is provided to face a tip 2A of the memory card 2 along the tip 2A, at the side of a second surface 2C of the memory card 2, in a state where the memory card 2 is held at a connection position by a connector 14. Further, a pair of connection units 31A is connected to both end portions of a width direction of the capacitance addition unit 30A and is connected to a ground provided on a top surface of a circuit board 12.

Even in this configuration, the electronic component 3A is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30A and the pair of connection units 31A. With this arrangement, it is possible to bypass at least a part of a current generated from an antenna or the like.

Second Modification

Figure 12A:
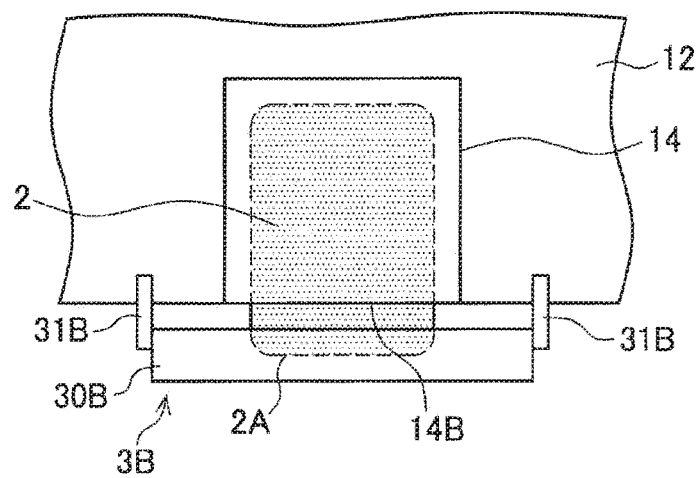
FIG. 12A is a top view showing a configuration example of a circuit board to which an electronic component according to a second modification of the same embodiment is attached.
Figure 12B:
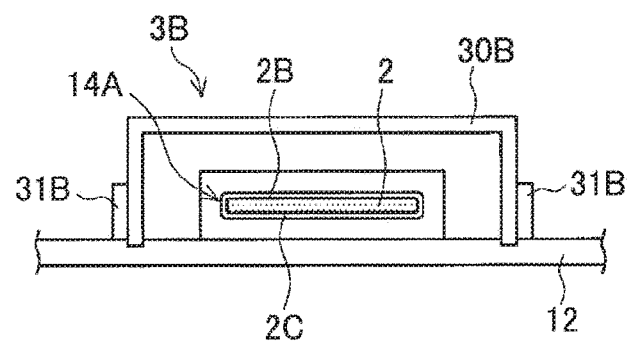
FIG. 12B is a front view showing a configuration example of a circuit board to which an electronic component according to the same modification is attached.

FIGS. 12A and 12B are respectively a top view and a front view showing a configuration example of a circuit board to which an electronic component according to a second modification of the present embodiment is attached. As shown in FIGS. 12A and 12B, a capacitance addition unit 30B configuring an electronic component 3B according to the present modification forms an inverse U shape in a cross-sectional view orthogonal to an insertion/removal direction of a memory card 2. Further, the capacitance addition unit 30B is provided to face a tip 2A of the memory card 2 along the tip 2A, at the side of a first surface 2B of the memory card 2, in a state where the memory card 2 is held at a connection position by a connector 14. Further, a pair of connection units 31B is connected to side portions extending downward from both end portions of a width direction of the capacitance addition unit 30B and is connected to a ground provided on a top surface of a circuit board 12.

Even in this configuration, the electronic component 3B is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30B and the pair of connection units 31B. With this arrangement, it is possible to bypass at least a part of a current generated from an antenna or the like.

Third Modification

Figure 13A:
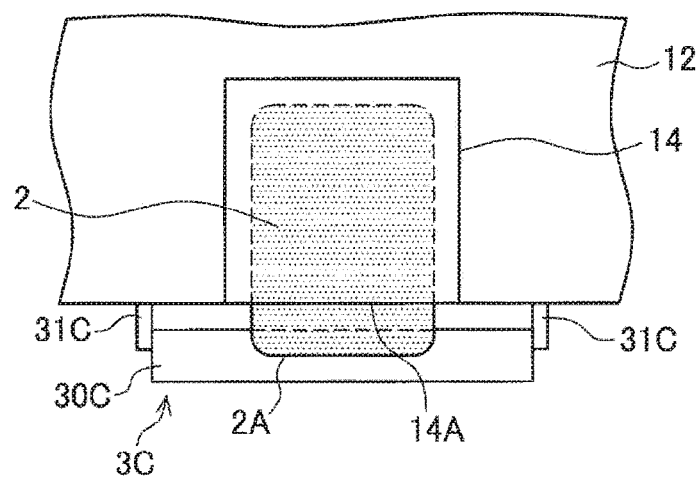
FIG. 13A is a top view showing a configuration example of a circuit board to which an electronic component according to a third modification of the same embodiment is attached.
Figure 13B:
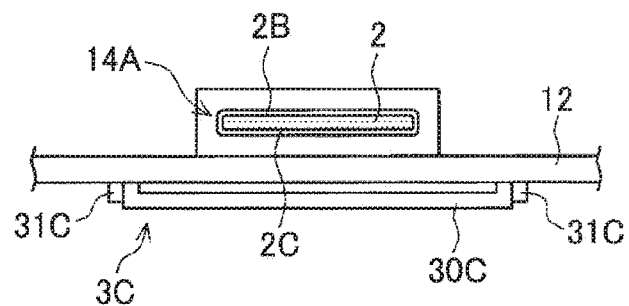
FIG. 13B is a front view showing a configuration example of a circuit board to which an electronic component according to the same modification is attached.

FIGS. 13A and 13B are respectively a top view and a front view showing a configuration example of a circuit board to which an electronic component according to a third modification of the present embodiment is attached. As shown in FIGS. 13A and 13B, a capacitance addition unit 30C configuring an electronic component 3C according to the present modification forms a U shape in a cross-sectional view orthogonal to an insertion/removal direction of a memory card 2. Further, the capacitance addition unit 30C is provided to face a tip 2A of the memory card 2 along the tip 2A, at the side of a second surface 2C of the memory card 2, in a state where the memory card 2 is held at a connection position by a connector 14. Further, a pair of connection units 31C is connected to side portions extending upward from both end portions of a width direction of the capacitance addition unit 30C and is connected to a ground provided on a bottom surface of a circuit board 12.

Even in this configuration, the electronic component 3C is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30C and the pair of connection units 31C. With this arrangement, it is possible to bypass at least a part of a current generated from an antenna or the like.

Fourth Modification

Figure 14A:
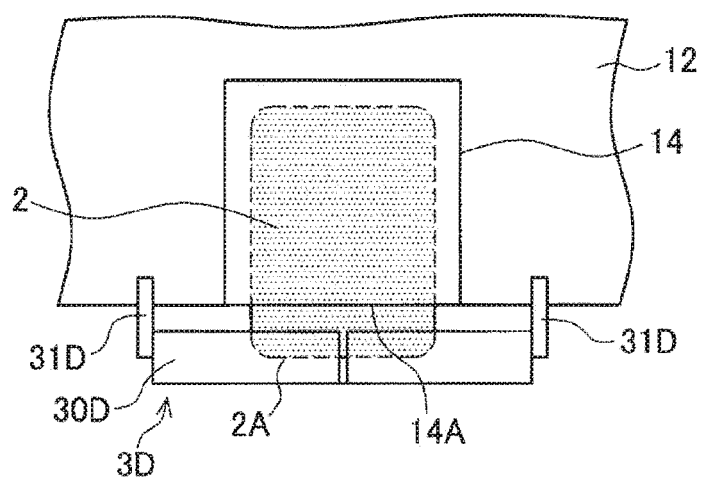
FIG. 14A is a top view showing a configuration example of a circuit board to which an electronic component according to a fourth modification of the same embodiment is attached.
Figure 14B:
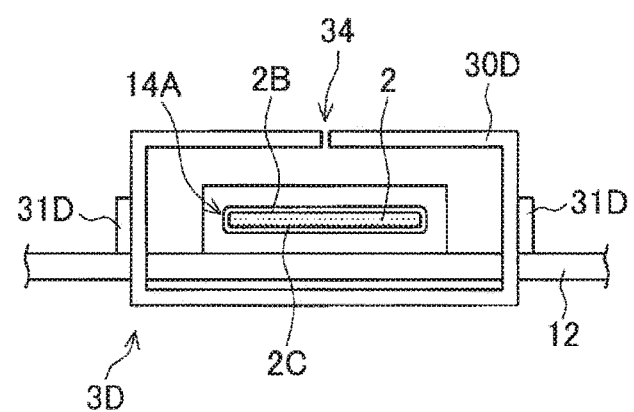
FIG. 14B is a front view showing a configuration example of a circuit board to which an electronic component according to the same modification is attached.

FIGS. 14A and 14B are respectively a top view and a front view showing a configuration example of a circuit board to which an electronic component according to a fourth modification of the present embodiment is attached. As shown in FIGS. 14A and 14B, a capacitance addition unit 30D configuring an electronic component 3D according to the present modification has an opened cross-sectional shape in which a gap 34 is provided at an upper side, in a cross-sectional view orthogonal to an insertion/removal direction of a memory card 2. Further, the capacitance addition unit 30D is provided to face and surround a tip 2A of the memory card 2, at the side of a first surface 2B and the side of a second surface 2C of the memory card 2, in a state where the memory card 2 is held at a connection position by a connector 14. Further, a pair of connection units 31D is connected to side portions extending in a vertical direction from both end portions of a width direction of the capacitance addition unit 30D and is connected to a ground provided on a top surface of a circuit board 12.

Even in this configuration, the electronic component 3D is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30D and the pair of connection units 31D. With this arrangement, it is possible to bypass at least a part of a current generated from an antenna or the like.

Fifth Modification

Figure 15A:
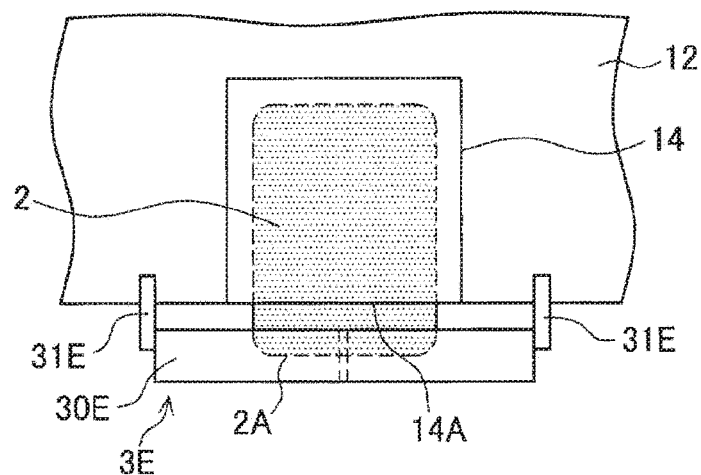
FIG. 15A is a top view showing a configuration example of a circuit board to which an electronic component according to a fifth modification of the same embodiment is attached.
Figure 15B:
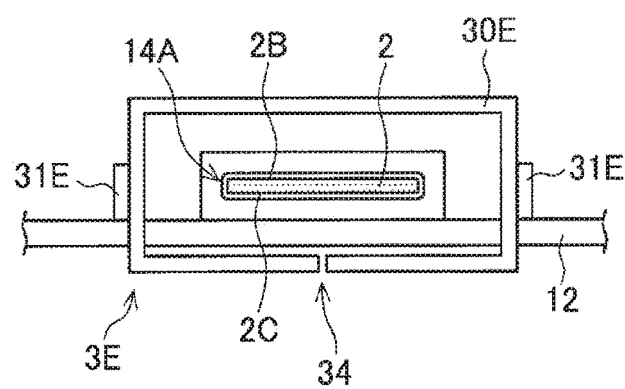
FIG. 15B is a front view showing a configuration example of a circuit board to which an electronic component according to the same modification is attached.

FIGS. 15A and 15B are respectively a top view and a front view showing a configuration example of a circuit board to which an electronic component according to a fifth modification of the present embodiment is attached. As shown in FIGS. 15A and 15B, a capacitance addition unit 30E configuring an electronic component 3E according to the present modification has an opened cross-sectional shape in which a gap 34 is provided at a lower side, in a cross-sectional view orthogonal to an insertion/removal direction of a memory card 2. Further, the capacitance addition unit 30E is provided to surround a tip 2A of the memory card 2, in a state where the memory card 2 is held at a connection position by a connector 14. Further, a pair of connection units 31E is connected to side portions extending in a vertical direction from both end portions of a width direction of the capacitance addition unit 30E and is connected to a ground provided on a top surface of a circuit board 12.

Even in this configuration, the electronic component 3E is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30E and the pair of connection units 31E. With this arrangement, it is possible to bypass at least a part of a current generated from an antenna or the like.

Sixth Modification

Figure 16:
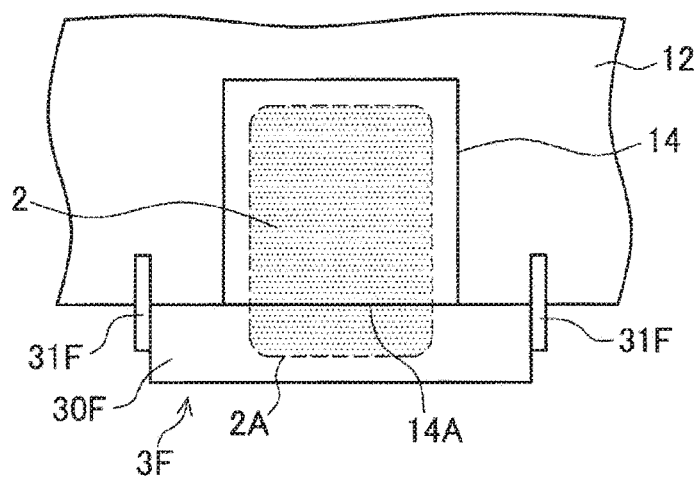
FIG. 16 is a top view showing a configuration example of a circuit board to which an electronic component according to a sixth modification of the same embodiment is attached.

FIG. 16 is a top view showing a configuration example of a circuit board to which an electronic component according to a sixth modification of the present embodiment is attached. Further, since a front view showing the configuration example of the circuit board according to the present modification is similar to that shown in FIG. 6B, the front view is omitted. As shown in FIG. 16, a capacitance addition unit 30F configuring an electronic component 3F according to the present modification is provided to cover a portion of a memory card 2 exposed from a card mounting port 14A of a connector 14 in a plan view, in a state where the memory card 2 is held at a connection position by the connector 14. That is, the capacitance addition unit 30F is provided to face a portion of the memory card 2 from the card mounting port 14A to a tip 2A of the memory card 2.

In this configuration, the capacitance addition unit 30F covers the portion of the memory card 2 exposed from the card mounting port 14A of the connector 14, so that it is possible to more surely prevent occurrence of noise due to the memory card 2 or reception of the noise by the memory card 2. Therefore, an influence on an external device and the like by the memory card 2 can be more surely suppressed. Further, an influence on an operation of the memory card 2 by the noise received by the memory card 2 can be further reduced.

Seventh Modification

Figure 17A:
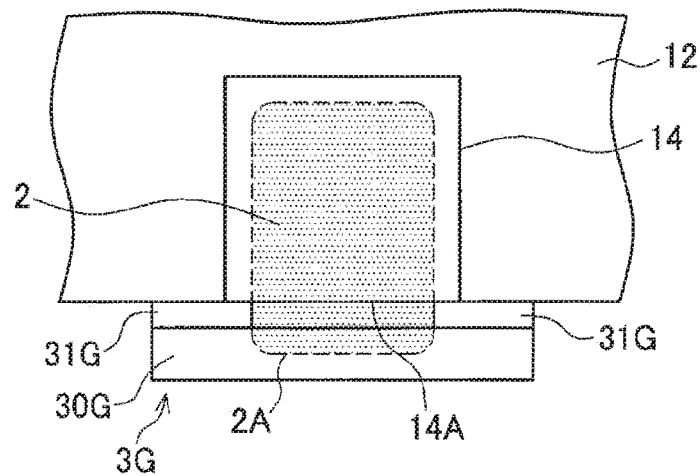
FIG. 17A is a top view showing a configuration example of a circuit board to which an electronic component according to a seventh modification of the same embodiment is attached.
Figure 17B:
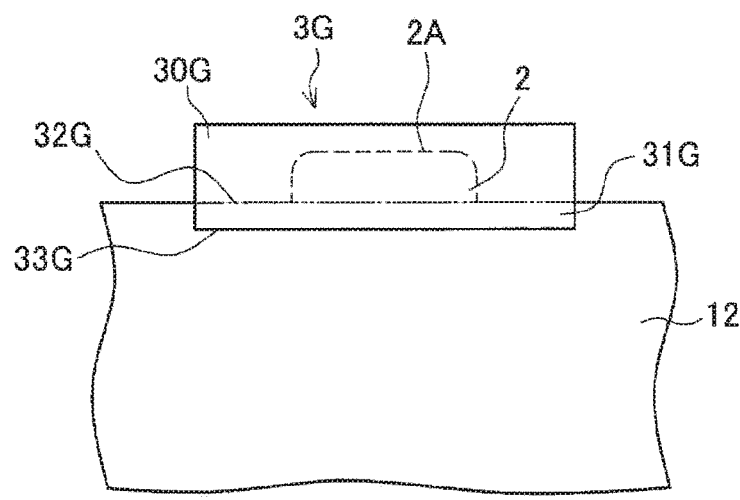
FIG. 17B is a bottom view showing a configuration example of a circuit board to which an electronic component according to the same modification is attached.
Figure 17C:
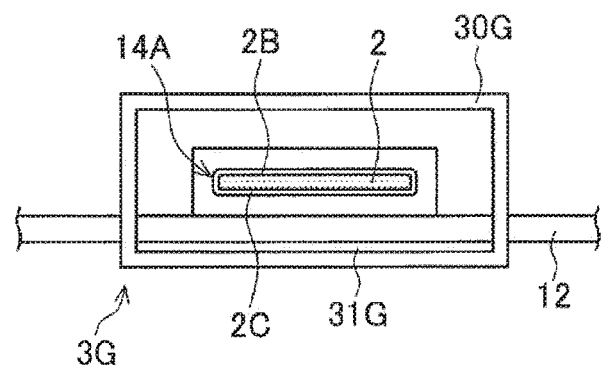
FIG. 17C is a front view showing a configuration example of a circuit board to which an electronic component according to the same modification is attached.

FIGS. 17A, 17B, and 17C are respectively a top view, a bottom view, and a front view showing a configuration example of a circuit board to which an electronic component according to a seventh modification of the present embodiment is attached. As shown in FIGS. 17A to 17C, a capacitance addition unit 30G configuring an electronic component 3G according to the present modification has a closed cross-sectional shape in a cross-sectional view orthogonal to an insertion/removal direction of a memory card 2. Further, the capacitance addition unit 30G is provided to surround a tip 2A of the memory card 2, in a state where the memory card 2 is held at a connection position by the connector 14. Further, as shown in FIG. 17B, a connection unit 31G is formed in a plate shape and is formed continuously with a portion of the lower end side of the capacitance addition unit 30G. In this case, a portion continuous with the portion of the lower end side of the capacitance addition unit 30G becomes a first end portion 32G. Further, the connection unit 31G is connected to a ground provided on a bottom surface of a circuit board 12 at a second end portion 33G. Note that the ground may be connected to at least a part of the second end portion 33G.

In this configuration, the capacitance addition unit 30G and the connection unit 31G cover a portion of the memory card 2 exposed from a card mounting port 14A of the connector 14, so that it is possible to more surely prevent occurrence of noise due to the memory card 2 or reception of the noise by the memory card 2. Therefore, an influence on an external device and the like by the memory card 2 can be more surely suppressed. Further, an influence on an operation of the memory card 2 by the noise received by the memory card 2 can be further reduced.

Eighth Modification

Figure 18:
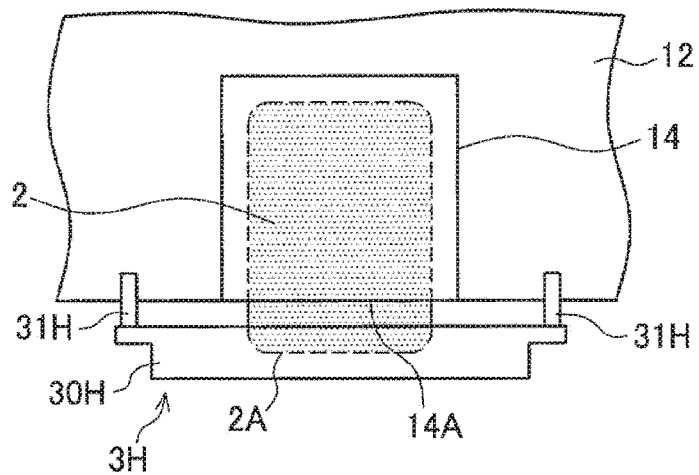
FIG. 18 is a top view showing a configuration example of a circuit board to which an electronic component according to an eighth modification of the same embodiment is attached.

FIG. 18 is a top view showing a configuration example of a circuit board to which an electronic component according to an eighth modification of the present embodiment is attached. Further, a capacitance addition unit 30H is provided to surround a tip 2A of a memory card 2, in a state where the memory card 2 is held at a connection position by a connector 14. As shown in FIG. 18, the capacitance addition unit 30H configuring an electronic component 3H according to the present modification is provided with protrusion portions connected to connection units 31H at both ends in a width direction.

Further, the connection unit 31H according to the present modification is formed of a metal spring. The metal spring is an example of a conductive extendable member. The connection unit 31H is formed of the metal spring, so that a position of the capacitance addition unit 30H can be appropriately adjusted. With this arrangement, insertion and removal of the memory card 2 with respect to the connector 14 are facilitated, and the position of the capacitance addition unit 30H with respect to the tip 2A in a state where the memory card 2 is held at the connection position can be adjusted.

Ninth Modification

Figure 19A:
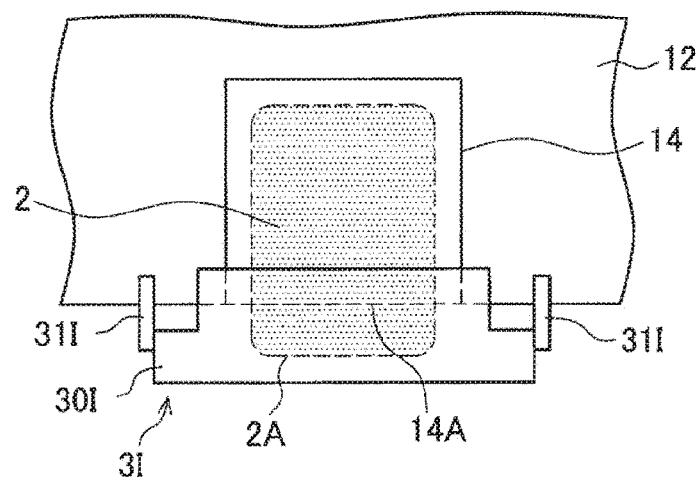
FIG. 19A is a top view showing a configuration example of a circuit board to which an electronic component according to a ninth modification of the same embodiment is attached.
Figure 19B:
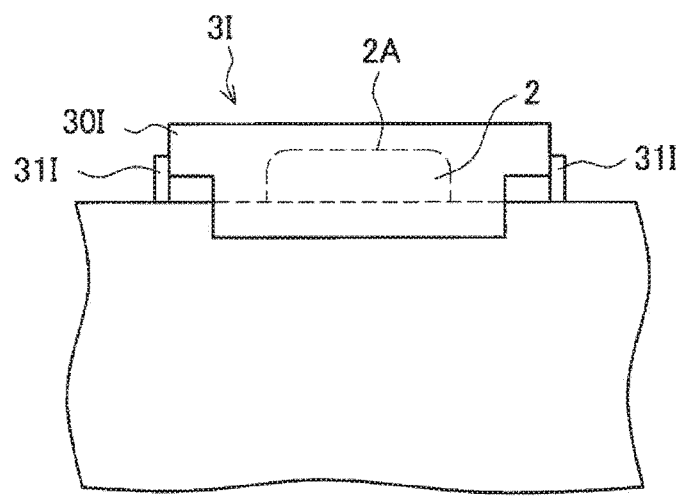
FIG. 19B is a bottom view showing a configuration example of a circuit board to which an electronic component according to the same modification is attached.

FIGS. 19A and 19B are respectively a top view and a bottom view showing a configuration example of a circuit board to which an electronic component according to a ninth modification of the present embodiment is attached. Further, a capacitance addition unit 30I is provided to surround a tip 2A of a memory card 2, in a state where the memory card 2 is held at a connection position by a connector 14. As shown in FIGS. 19A and 19B, upper and lower portions of the capacitance addition unit 30I have protrusion portions in which center portions in a width direction protrude to the side of a circuit board 12. Further, a pair of connection units 31I is connected to both end portions of a width direction of the capacitance addition unit 30I and is connected to a ground provided on a top surface of the circuit board 12.

In this configuration, the protrusion portion of the capacitance addition unit 30I covers a portion of the memory card 2 exposed from a card mounting port 14A of the connector 14 and a surrounding portion including the card mounting port 14A of the connector 14, so that it is possible to more surely prevent occurrence of noise due to the memory card 2 or reception of the noise by the memory card 2. Therefore, an influence on an external device and the like by the memory card 2 can be more surely suppressed. Further, an influence on an operation of the memory card 2 by the noise received by the memory card 2 can be further reduced.

Tenth Modification

Figure 20A:
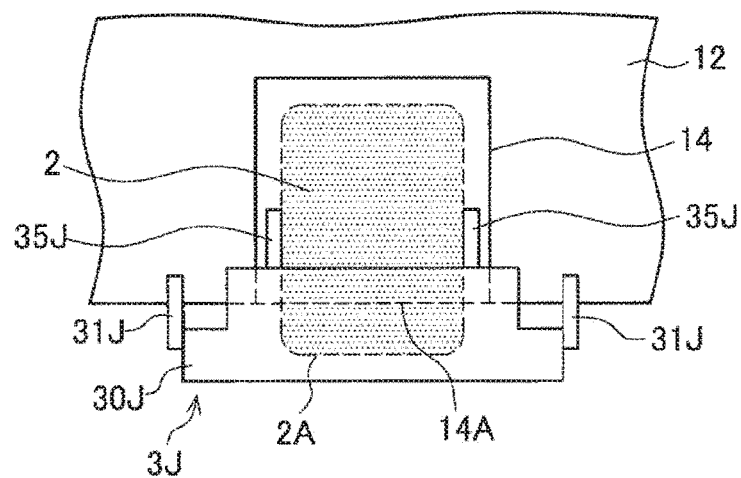
FIG. 20A is a top view showing a configuration example of a circuit board to which an electronic component according to a tenth modification of the same embodiment is attached.
Figure 20B:
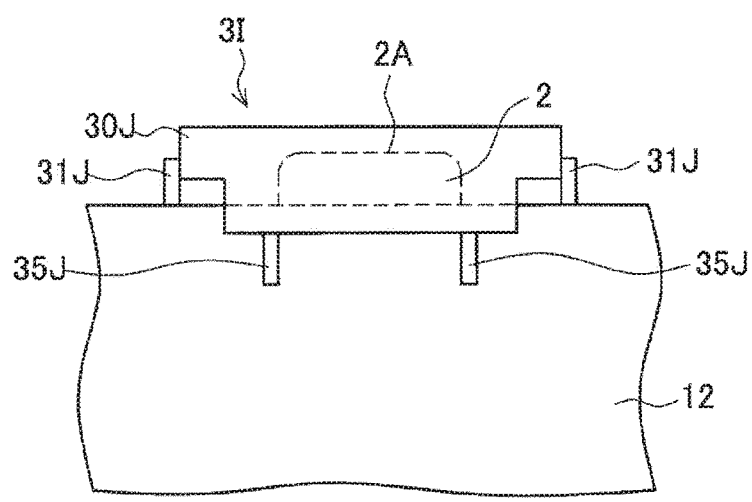
FIG. 20B is a bottom view showing a configuration example of a circuit board to which an electronic component according to the same modification is attached.
Figure 20C:
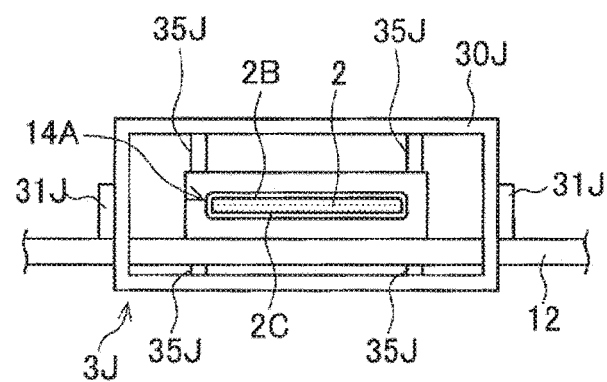
FIG. 20C is a front view showing a configuration example of a circuit board to which an electronic component according to the same modification is attached.

FIGS. 20A, 20B, and 20C are respectively a top view, a bottom view, and a front view showing a configuration example of a circuit board to which an electronic component according to a tenth modification of the present embodiment is attached. As shown in FIGS. 20A to 20C, a capacitance addition unit 30J configuring an electronic component 3J according to the present modification has a closed cross-sectional shape in a cross-sectional view orthogonal to an insertion/removal direction of a memory card 2. Further, the capacitance addition unit 30J is provided to surround a tip 2A of the memory card 2, in a state where the memory card 2 is held at a connection position by a connector 14. Further, as shown in FIGS. 20A and 20B, upper and lower portions of the capacitance addition unit 30J have protrusion portions in which center portions in a width direction protrude to the side of a circuit board 12.

Further, in the present modification, as shown in FIGS. 20A to 20C, in addition to first connection units 31J connected to side portions extending in a vertical direction from both ends of the width direction of the capacitance addition unit 30J, second connection units 35J connected to the protrusion portions of the capacitance addition units 30J are provided. A portion of the second connection unit 35J different from the portion connected to the protrusion portion is connected to a ground provided in the circuit board 12 (including the connector 14). By appropriately providing the second connection unit 35J, a frequency characteristic of the noise wave circuit described above can be appropriately adjusted.

Eleventh Modification

Figure 21:
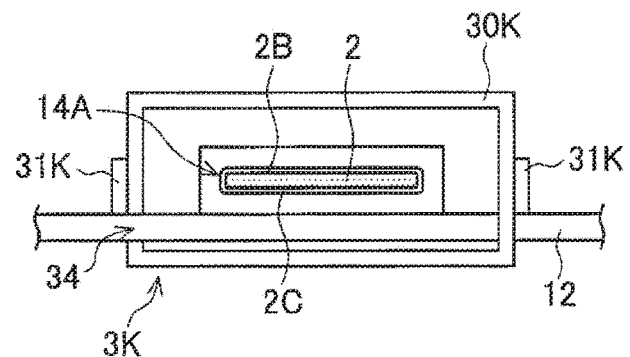
FIG. 21 is a front view showing a configuration example of a circuit board to which an electronic component according to an eleventh modification of the same embodiment is attached.

FIG. 21 is a front view showing a configuration example of a circuit board to which an electronic component according to an eleventh modification of the present embodiment is attached. Further, a capacitance addition unit 30K is provided to surround a tip 2A of a memory card 2, in a state where the memory card 2 is held at a connection position by a connector 14. As shown in FIG. 21, the capacitance addition unit 30K configuring an electronic component 3K according to the present modification has an opened cross-sectional shape in which a gap 34 is provided in side portions extending in a vertical direction from both end portions of a width direction of the capacitance addition unit 30K, in a cross-sectional view orthogonal to an insertion/removal direction of the memory card 2. Further, a pair of connection units 31K is connected to the side portions and is connected to a ground provided on a top surface of a circuit board 12.

Even in this configuration, the electronic component 3K is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30K and the pair of connection units 31K. With this arrangement, it is possible to bypass at least a part of a current generated from an antenna or the like.

Twelfth Modification

Figure 22:
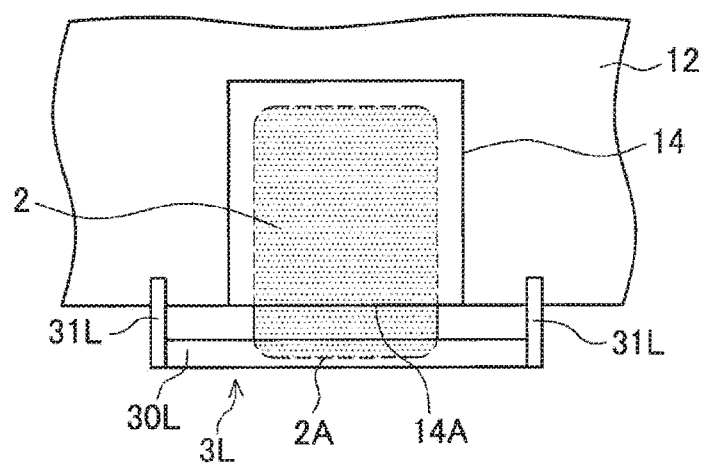
FIG. 22 is a top view showing a configuration example of a circuit board to which an electronic component according to a twelfth modification of the same embodiment is attached.

FIG. 22 is a top view showing a configuration example of a circuit board to which an electronic component according to a twelfth modification of the present embodiment is attached. Further, a capacitance addition unit 30L is provided to surround a tip 2A of a memory card 2, in a state where the memory card 2 is held at a connection position by a connector 14. Further, a pair of connection units 31L is connected to side portions extending in a vertical direction from both end portions of a width direction of the capacitance addition unit 30L and is connected to a ground provided on a top surface of a circuit board 12.

As shown in FIG. 22, a length of the capacitance addition unit 30L according to the present modification in an insertion/removal direction of the memory card 2 is shorter than a length of the capacitance addition unit 30 according to the above embodiment. However, the capacitance addition unit 30L is provided at a position facing the tip 2A, on the side of a first surface of the memory card 2.

Even in this configuration, the electronic component 3L is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30L and the pair of connection units 31L. With this arrangement, it is possible to bypass at least a part of a current generated from an antenna or the like.

Thirteenth Modification

Figure 23:
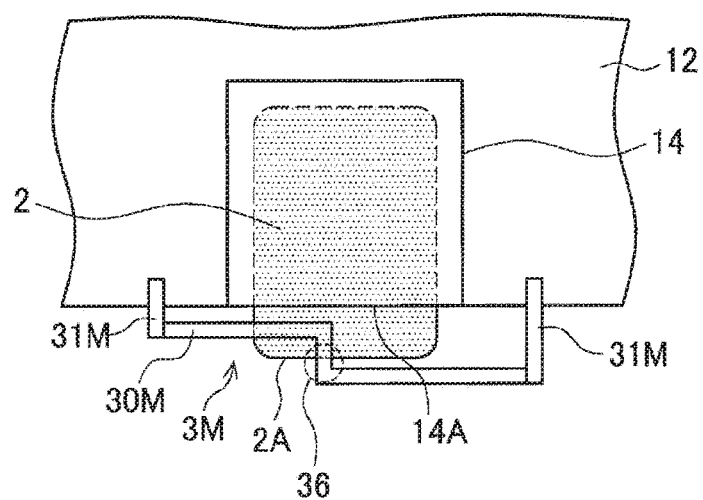
FIG. 23 is a top view showing a configuration example of a circuit board to which an electronic component according to a thirteenth modification of the same embodiment is attached.

FIG. 23 is a top view showing a configuration example of a circuit board to which an electronic component according to a thirteenth modification of the present embodiment is attached. As shown in FIG. 23, a capacitance addition unit 30M is provided so that a part of the capacitance addition unit 30M is at a position (region 36 in the drawing) facing a tip 2A on the side of a first surface of a memory card 2, in a state where the memory card 2 is held at a connection position by a connector 14. Further, in end portions of a width direction of the capacitance addition unit 30M, a pair of connection units 31M is connected to the capacitance addition unit 30M.

Even in this configuration, an electronic component 3M is provided, so that a floating capacitance can be added to the noise propagation circuit described above, even in a case where the capacitance addition unit 30M partially faces the tip 2A. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside a circuit board 12 by the capacitance addition unit 30M and the pair of connection units 31M. With this arrangement, it is possible to bypass at least a part of a current generated from an antenna or the like.

Fourteenth Modification

Figure 24A:
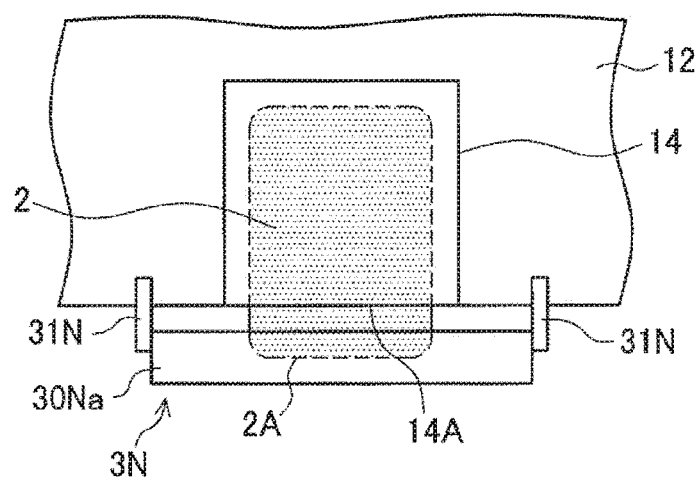
FIG. 24A is a top view showing a configuration example of a circuit board to which an electronic component according to a fourteenth modification of the same embodiment is attached.
Figure 24B:
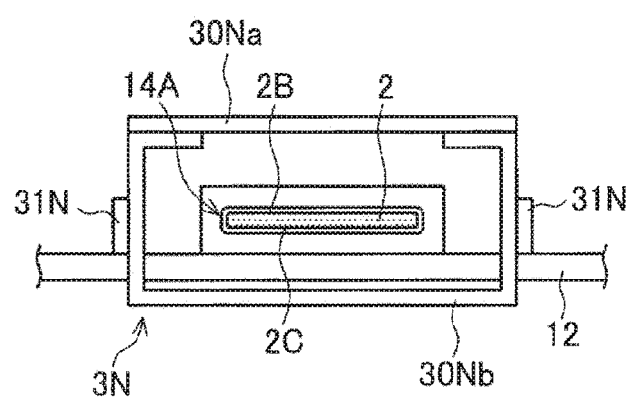
FIG. 24B is a bottom view showing a configuration example of a circuit board to which an electronic component according to the same modification is attached.

FIGS. 24A and 24B are respectively a top view and a front view showing a configuration example of a circuit board to which an electronic component according to a fourteenth modification of the present embodiment is attached. As shown in FIGS. 24A and 24B, a capacitance addition unit 30N is provided by joining a plate-like member 30Na and a member 30Nb having a flange surface and having a substantially U-shaped cross section by the flange surface. The capacitance addition unit 30N is provided to face and surround a tip 2A of a memory card 2, at the side of a first surface 2B and the side of a second surface 2C of the memory card 2, in a state where the memory card 2 is held at a connection position by a connector 14, and forms a closed cross section. Further, a pair of connection units 31N is connected to side portions extending in a vertical direction from both end portions of a width direction of the capacitance addition unit 30N and is connected to a ground provided on a top surface of a circuit board 12.

Even in a configuration using the capacitance addition unit 30N including a plurality of members, an electronic component 3N is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30N and the pair of connection units 31N. With this arrangement, it is possible to bypass at least a part of a current generated from an antenna or the like.

Fifteenth Modification

Figure 25A:
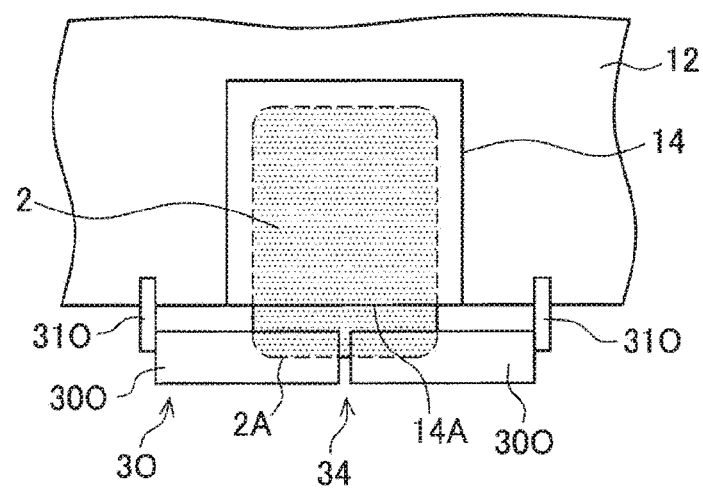
FIG. 25A is a top view showing a configuration example of a circuit board to which an electronic component according to a fifteenth modification of the same embodiment is attached.
Figure 25B:
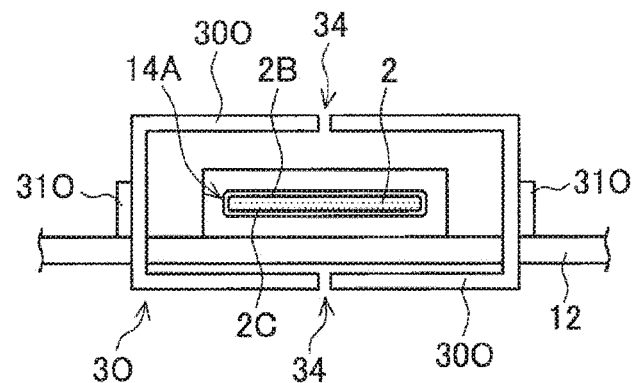
FIG. 25B is a bottom view showing a configuration example of a circuit board to which an electronic component according to the same modification is attached.

FIGS. 25A and 25B are respectively a top view and a front view showing a configuration example of a circuit board to which an electronic component according to a fifteenth modification of the present embodiment is attached. As shown in FIGS. 25A and 25B, capacitance addition units 30O configuring an electronic component 3O according to the present modification have an opened cross-sectional shape in which gaps 34 are respectively provided at an upper side and a lower side, in a cross-sectional view orthogonal to an insertion/removal direction of a memory card 2. That is, the capacitance addition units 30O are configured by two members.

Further, the capacitance addition units 30O are provided to face and surround a tip 2A of the memory card 2, at the side of a first surface 2B and the side of a second surface 2C of the memory card 2, in a state where the memory card 2 is held at a connection position by a connector 14. Further, a pair of connection units 31O is connected to side portions extending in a vertical direction from outer end portions of a width direction of the capacitance addition units 30O and is connected to a ground provided on a top surface of a circuit board 12.

Even in a configuration using the capacitance addition units 30O including the plurality of members, the electronic component 3O is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, an alternating current (AC)-wise transmission path is formed outside the circuit board 12 by the capacitance addition units 30O and the pair of connection units 31O. With this arrangement, it is possible to bypass at least a part of a current generated from an antenna or the like.

Sixteenth Modification

Figure 26A:
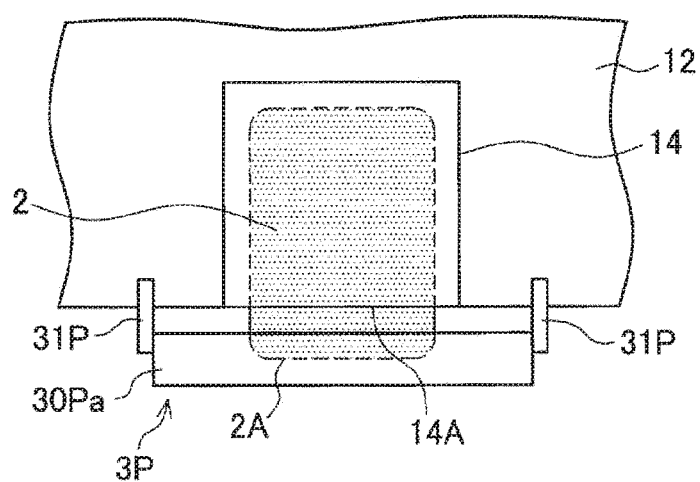
FIG. 26A is a top view showing a configuration example of a circuit board to which an electronic component according to a sixteenth modification of the same embodiment is attached.
Figure 26B:
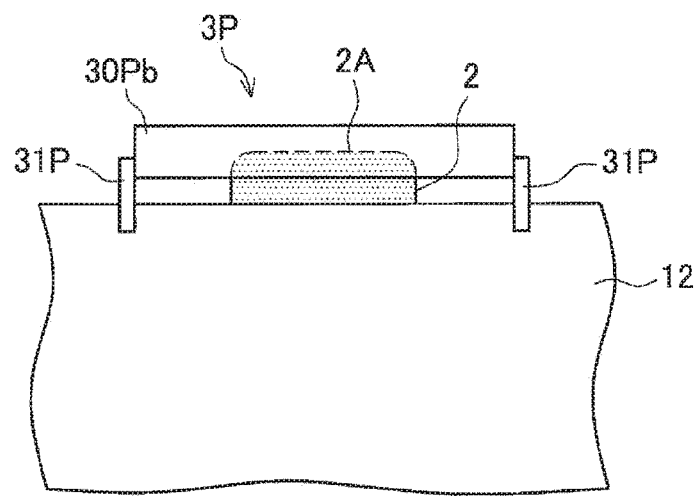
FIG. 26B is a bottom view showing a configuration example of a circuit board to which an electronic component according to the same modification is attached.
Figure 26C:
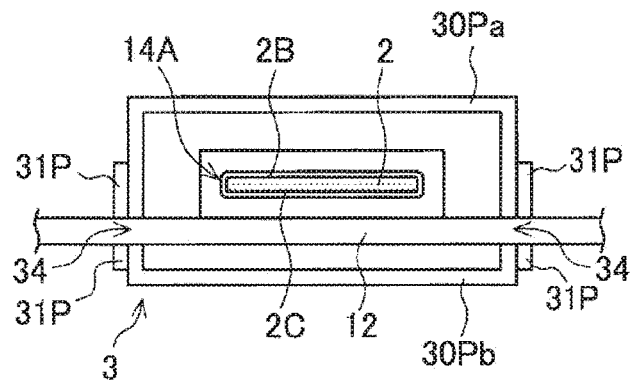
FIG. 26C is a front view showing a configuration example of a circuit board to which an electronic component according to the same modification is attached.

FIGS. 26A, 26B, and 26C are respectively a top view, a bottom view, and a front view showing a configuration example of a circuit board to which an electronic component according to a sixteenth modification of the present embodiment is attached. As shown in FIGS. 26A to 26C, capacitance addition units 30P configuring an electronic component 3P according to the present modification have an opened cross-sectional shape in which gaps 34 are respectively provided in side portions extending in a vertical direction from an outer end portions of a width direction of the capacitance addition units 30P, in a cross-sectional view orthogonal to an insertion/removal direction of a memory card 2. That is, the capacitance addition units 30P are configured by two members of an upper inverted U-shaped member 30Pa and a lower U-shaped member 30Pb.

Further, the capacitance addition units 30P are provided to face and surround a tip 2A of the memory card 2, at the side of a first surface 2B and the side of a second surface 2C of the memory card 2, in a state where the memory card 2 is held at a connection position by a connector 14. Further, as shown in FIG. 26C, connection units 31P are connected to side portions of the capacitance addition units 30P and are connected to grounds provided on a top surface and a bottom surface of a circuit board 12.

Even in a configuration using the capacitance addition units 30P including the plurality of members, the electronic component 3P is provided, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the capacitance addition unit 30Pa, a pair of connection units 31P and 30Pb and a pair of connection units 31P. With this arrangement, it is possible to bypass at least a part of a current generated from an antenna or the like.

Seventeenth Modification

Figure 27A:
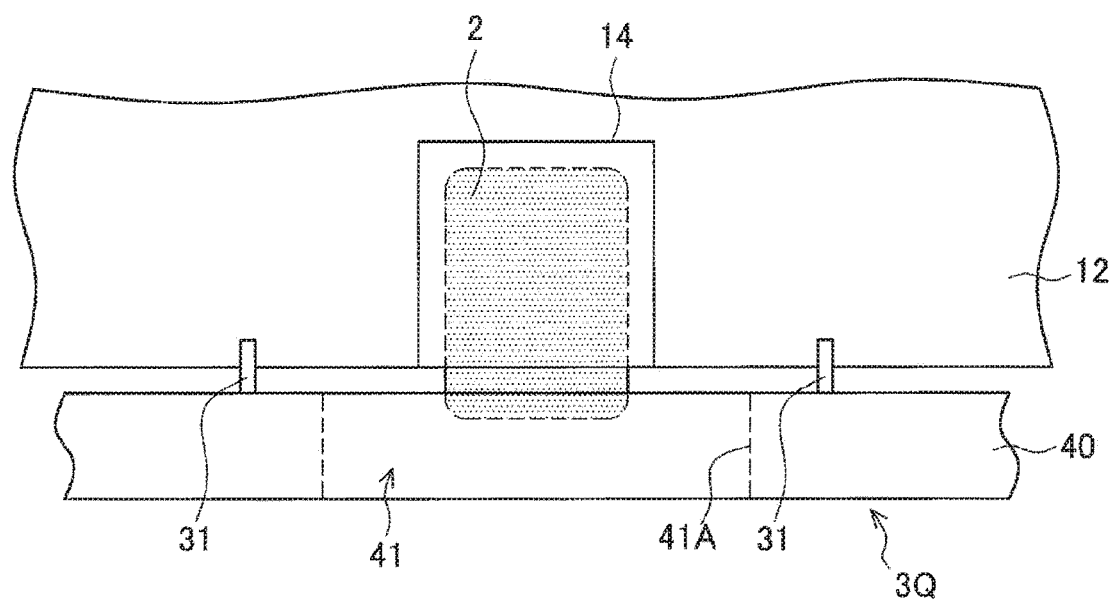
FIG. 27A is a top view showing a configuration example of a circuit board to which an electronic component according to a seventeenth modification of the same embodiment is attached.
Figure 27B:
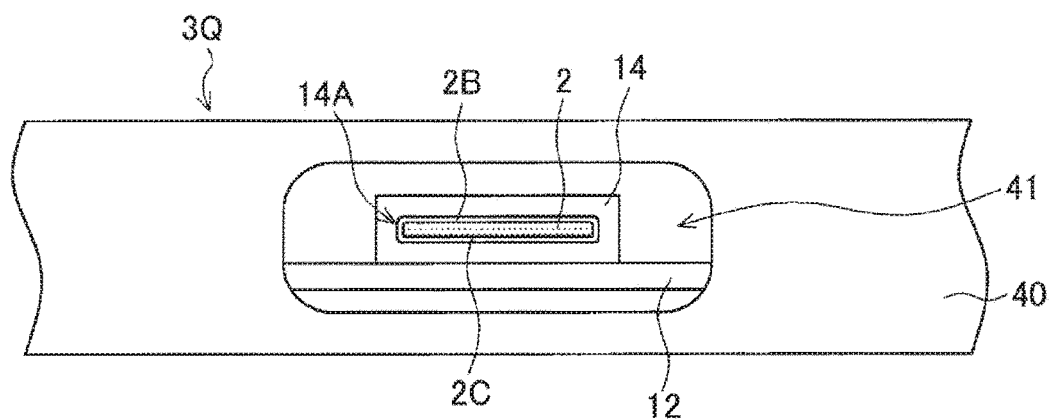
FIG. 27B is a bottom view showing a configuration example of a circuit board to which an electronic component according to the same modification is attached.

FIGS. 27A and 27B are respectively a top view and a front view showing a configuration example of a circuit board to which an electronic component according to a seventeenth modification of the present embodiment is attached. As shown in FIGS. 27A and 27B, an electronic component 3Q according to the present modification is configured by a casing 40 and connection units 31. That is, the casing 40 has a function as a capacitance addition unit 30.

As shown in FIG. 27B, the casing 40 is provided with an opening 41 in an insertion/removal direction of a memory card 2 from a card mounting port 14A of a connector 14. In this case, as shown in FIGS. 27A and 27B, an opening circumferential end 41A of the opening 41 is provided to surround a tip 2A of the memory card 2, in a state where the memory card 2 is held at a connection position by the connector 14. Further, as shown in FIG. 27A, a pair of connection units 31 is connected to side portions of the casing 40 at the side of a circuit board 12 and is connected to a ground provided on a top surface of the circuit board 12.

Even in this configuration, the opening circumferential end 41A of the casing 40 is used as the capacitance addition unit 30, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the casing 40 and the pair of connection units 31. With this arrangement, it is possible to bypass at least a part of a current generated from an antenna or the like.

Note that, in the example shown in FIGS. 27A and 27B, the casing 40 is described as a part of a member that accommodates the circuit board 12, but, the present technology is not limited to this example. For example, at least one component configuring the casing for accommodating the circuit board 12 may have a configuration corresponding to the casing 40 shown in FIGS. 27A and 27B. That is, at least one component may be provided as the capacitance addition unit 30 described above.

Further, at least one component may be an antenna fixed to the casing, for example. The component can be used as an antenna because isolation with the memory card 2 can be secured. Further, the connection unit 31 may be formed of a conductive extendable member such as a metal spring as described above.

Eighteenth Modification

Figure 28A:
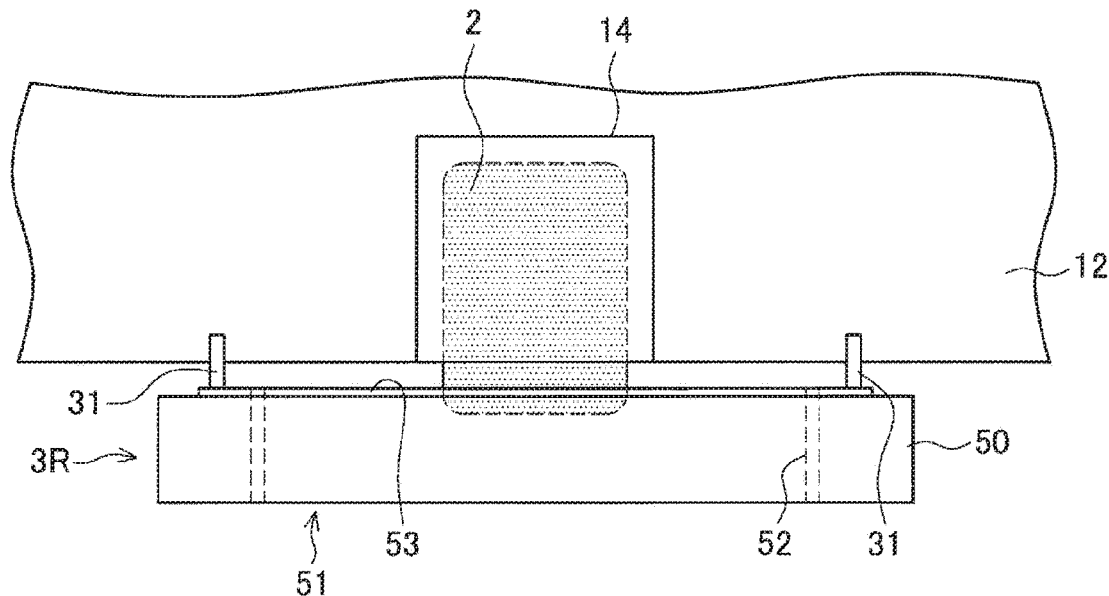
FIG. 28A is a top view showing a configuration example of a circuit board to which an electronic component according to an eighteenth modification of the same embodiment is attached.
Figure 28B:
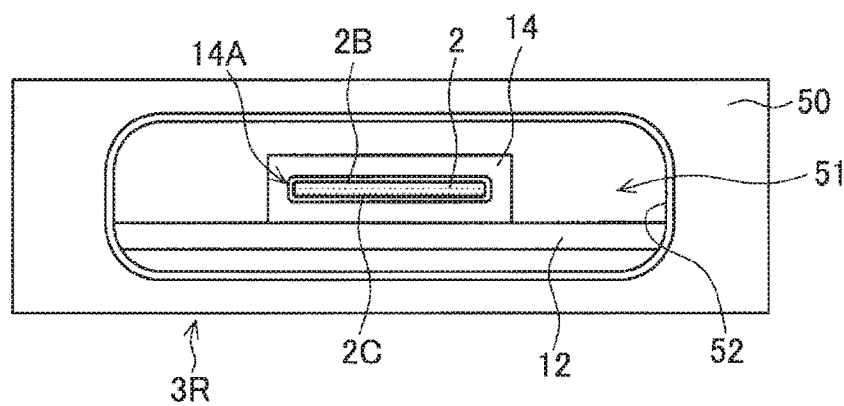
FIG. 28B is a bottom view showing a configuration example of a circuit board to which an electronic component according to the same modification is attached.
Figure 28C:
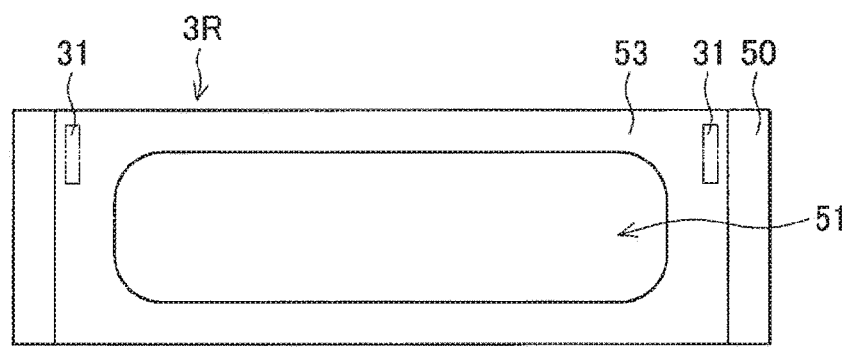
FIG. 28C is a rear view of an electronic component according to the same modification.

FIGS. 28A and 28B are respectively a top view and a front view showing a configuration example of a circuit board to which an electronic component according to an eighteenth modification of the present embodiment is attached. Further, FIG. 28C is a rear view of the electronic component according to the present modification. That is, a rear view of an electronic component 3R shown in FIG. 28C shows a configuration of the electronic component 3R viewed from the side of a circuit board 12 in a case of being attached to the circuit board 12.

As shown in FIGS. 28A and 28B, the electronic component 3R is provided at a position corresponding to a card mounting port 14A of a connector 14. The electronic component 3R has a dielectric component 50, a first plating unit 52, a second plating unit 53, and connection units 31. An opening 51 is provided in an insertion/removal direction of a memory card 2 from the card mounting port 14A of the connector 14 in the dielectric component 50. An opening circumferential end of the opening 51 is provided with the first plating unit 52. Further, a surface 50A of the dielectric component 50 at the side of the circuit board 12 is provided with the second plating unit 53. The first plating unit 52 and the second plating unit 53 are connected at a crossing portion of the surface 50A and the opening 51. The connection unit 31 connects the second plating unit 53 and a ground provided on the circuit board 12.

As this time, as shown in FIGS. 28A and 28B, in a state where a memory card 2 is held at a connection position by the connector 14, the first plating unit 52 formed in the opening circumferential end of the opening 51 surrounds a tip 2A of the memory card 2. Even in this configuration, the first plating unit 52 is used as a capacitance addition unit 30, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2.

Further, even in this configuration, a transmission path is formed outside the circuit board 12 by the first plating unit 52, the second plating unit 53, and a pair of connection units 31. With this arrangement, it is possible to bypass at least a part of a current generated from an antenna or the like.

As described above, even in a case where a part of the components configuring the circuit board 12 is formed of a dielectric, metal plating or the like is performed on an inner circumferential end face of the opening of the dielectric, so that it is possible to realize a function as the capacitance addition unit 30. Note that, in the present modification, although an example of performing the metal plating on the inner circumferential end face of the opening of the dielectric has been described, the present technology is not limited to this example. For example, a conductive sheet including a metal or the like may be attached to the inner circumferential end face along the inner circumferential end face. That is, if a conductor portion is disposed along the inner circumferential end face of the opening of the dielectric, an effect as the capacitance addition unit 30 described above can be exhibited. Further, the first plating unit 52 and the second plating unit 53 may have a function as an antenna fixed to a casing.

Nineteenth Modification

Figure 29A:
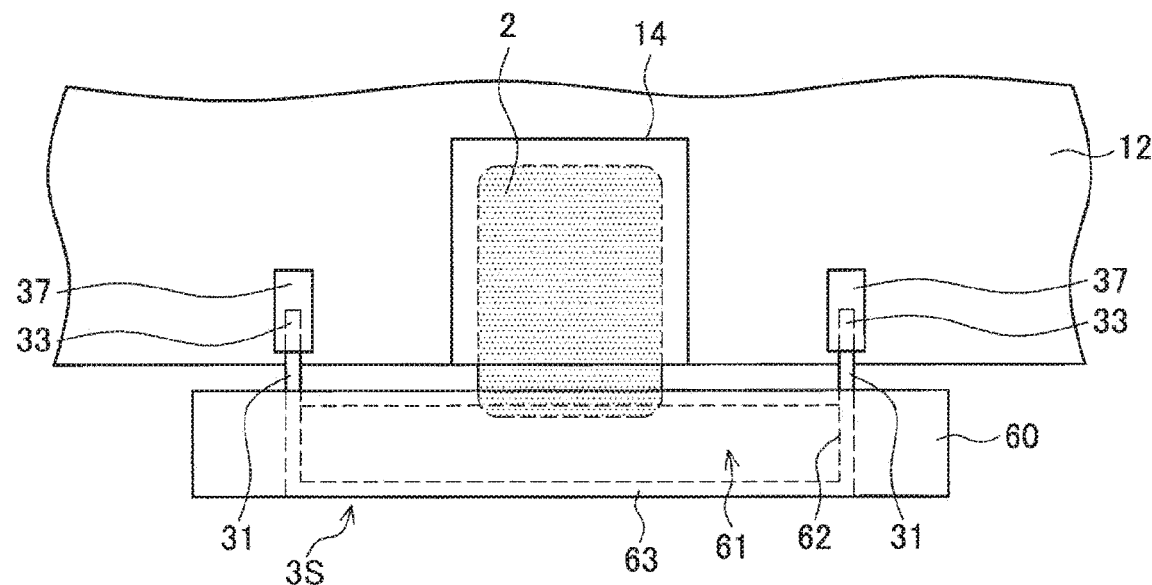
FIG. 29A is a top view showing a configuration example of a circuit board to which an electronic component according to a nineteenth modification of the same embodiment is attached.
Figure 29B:
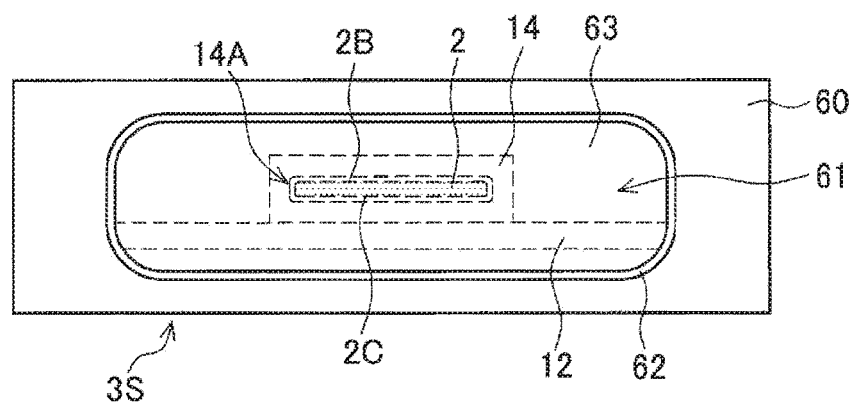
FIG. 29B is a front view showing a configuration example of a circuit board to which an electronic component according to the same modification is attached.
Figure 29C:
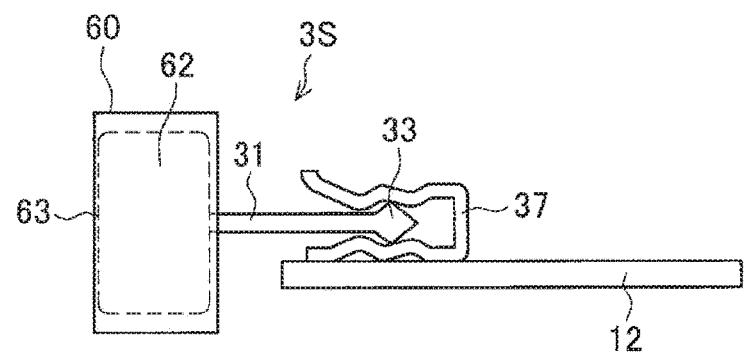
FIG. 29C is a side view showing a configuration example of a circuit board to which an electronic component according to the same modification is attached.

FIGS. 29A, 29B, and 29C are respectively a top view, a front view, and a side view showing a configuration example of a circuit board to which an electronic component according to a nineteenth modification of the present embodiment is attached. As shown in FIGS. 28A and 28B, an electronic component 3S is provided at a position corresponding to a card mounting port 14A of a connector 14. The electronic component 3S has a dielectric component 60, an inner portion 62, a lid 63, and connection units 31. An opening 61 is provided in an insertion/removal direction of a memory card 2 from the card mounting port 14A of the connector 14 in the dielectric component 60. The conductive inner portion 62 is formed in an opening circumferential end of the opening 61. Further, the lid 63 is formed at the side where the memory card 2 is exposed from the card mounting port 14A in a state where the memory card 2 is held at a connection position by the connector 14. As shown in FIG. 29B, the lid 63 is connected to an end portion of the inner portion 62 in a direction in which the memory card 2 is extracted. As this time, as shown in FIGS. 29A and 29B, in a state where the memory card 2 is held at the connection position by the connector 14, a portion corresponding to the inner circumferential end of the opening 61 of the dielectric component 60 in the inner portion 62 surrounds a tip 2A of the memory card 2. Further, as shown in FIGS. 29A and 29B, the lid 63 can exist at a position facing the tip 2A, in a state where the memory card 2 is held at the connection position by the connector 14.

Further, a receptacle 37 connected to a ground of a circuit board 12 is disposed in the circuit board 12. At this time, a second end portion 33 of the connection unit 31 is removably provided in the receptacle 37. For example, as shown in FIG. 29C, a shape of the second end portion 33 may be a shape that can be fitted into an inner portion of the receptacle 37.

Even in this configuration, the inner portion 62 and the lid 63 are used as a capacitance addition unit 30, so that a floating capacitance can be added to the noise propagation circuit described above. With this arrangement, it is possible to reduce the strength of noise radiated from the tip 2A of the memory card 2 and to further stabilize an operation of the memory card 2 while securing convenience of insertion and removal of the memory card 2. Further, since the inner portion 62 and the lid 63 three-dimensionally surround a surrounding portion of the tip 2A of the memory card 2, the inner portion 62 and the lid 63 can function as a shield and prevent emission of noise to the outside and reception of noise from the outside.

Further, since the receptacle 37 and the second end portion 33 of the connection unit 31 can be easily attached and detached, the convenience of insertion and removal of the memory card 2 can be maintained even in a case where the lid 63 is provided.

Further, even in this configuration, a transmission path is formed outside the circuit board 12 by the inner portion 62, the lid 63, and the pair of connection units 31. With this arrangement, it is possible to bypass at least a part of a current generated from an antenna or the like.

Twentieth Modification

Figure 30:
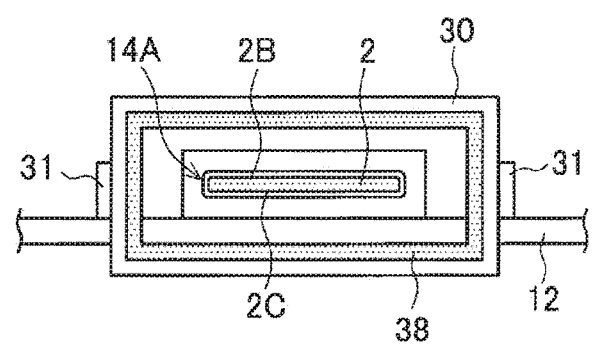
FIG. 30 is a front view showing a configuration example of a circuit board to which an electronic component according to a twentieth modification of the same embodiment is attached.

FIG. 30 is a front view showing a configuration example of a circuit board to which an electronic component according to a twentieth modification of the present embodiment is attached. As shown in FIG. 30, a capacitance addition unit 30 configuring an electronic component 3T according to the present modification has a closed cross-sectional shape in a cross-sectional view orthogonal to an insertion/removal direction of a memory card 2. Further, a capacitance addition unit 30 is provided to surround a tip 2A of the memory card 2, in a state where the memory card 2 is held at a connection position by a connector 14.

As shown in FIG. 30, a dielectric unit 38 is provided on an inner side of the capacitance addition unit 30 (that is, on the side of a card mounting port 14A of the connector 14 in a cross sectional view orthogonal to the insertion/removal direction of the memory card 2). The dielectric unit 38 is formed of a dielectric and is disposed along the inner side of the capacitance addition unit 30.

The relative permittivity $\varepsilon_r$ of the dielectric forming the dielectric unit 38 is generally higher than the permittivity of air. Therefore, a floating capacitance added by the installation of the electronic component 3T is larger than that in a case where the dielectric unit 38 is not provided. As such, the floating capacitance can be adjusted by disposing the dielectric unit 38. Therefore, it is possible to appropriately adjust a frequency characteristic of the noise propagation circuit described above.

Further, instead of the dielectric unit 38 described above, a magnetic body may be disposed on the inner side of the capacitance addition unit 30. Even in this case, it is possible to increase the floating capacitance.

The respective modifications of the present embodiment have been described.

3. Second Embodiment

Next, an electronic component according to a second embodiment of the present disclosure will be described.

Figure 31:
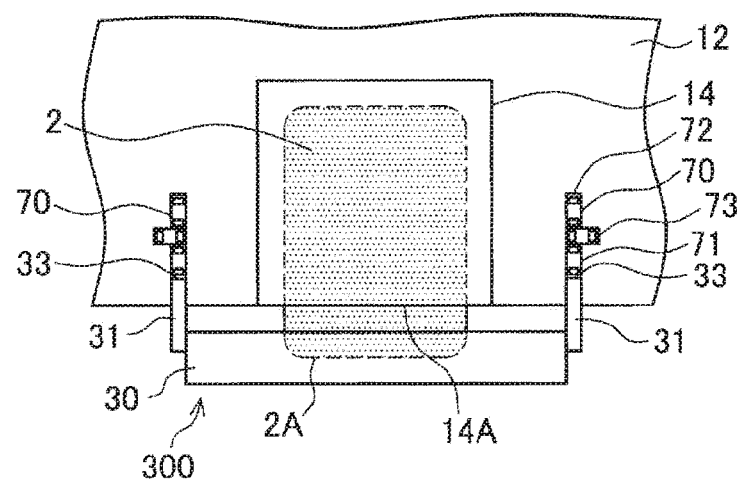
FIG. 31 is a top view showing a configuration example of a circuit board to which an electronic component according to a second embodiment of the present disclosure is attached.

FIG. 31 is a top view showing a configuration example of a circuit board to which the electronic component according to the second embodiment of the present disclosure is attached. FIG. 31 is a diagram showing a portion of a circuit board 12 provided in a casing 10 of a portable terminal 1, in which a connector 14 is provided. Further, since a configuration example of the circuit board seen from a front view is similar to that in the electronic component (refer to FIG. 6B) according to the first embodiment of the present disclosure, it is omitted.

Note that, in addition to the connector 14, the circuit board 12 is provided with a card controller that controls a memory card 2 and a wiring that electrically connects the card controller and the connector 14. Further, the circuit board 12 is appropriately provided with a circuit including a ground (GND). Further, the circuit board 12 may be further provided with a filter provided in the wiring and an antenna.

Referring to FIG. 31, an electronic component 300 according to the present embodiment includes a capacitance addition unit 30, a pair of connection units 31, and a pair of adjustment circuits 70.

As shown in FIG. 31, in the present embodiment, each of second end portions 33 of the pair of connection units 31 is not directly connected to the ground of the circuit board 12, but is connected to the ground via the adjustment circuit 70. Specifically, a first end portion 71 of the adjustment circuit 70 is connected to the second end portion 33 of the connection unit 31, and a second end portion 72 and a third end portion 73 of the adjustment circuit 70 are connected to the ground of the circuit board 12.

Note that, in the present specification, the adjustment circuit is a circuit configured by at least one of a lumped constant circuit or a distributed constant circuit. That is, the adjustment circuit may be configured by any one of the lumped constant circuit and the distributed constant circuit, or may be configured by a circuit in which the lumped constant circuit and the distributed constant circuit are mixed. The adjustment circuit can be configured by a known circuit including at least one of an inductor, a capacitor, or a resistor.

By incorporating the adjustment circuit 70 into the electronic component 300, it is possible to adjust a frequency characteristic of the noise propagation circuit described above. Here, a function by adjustment of the frequency characteristic of the noise propagation circuit will be described.

Figure 32:
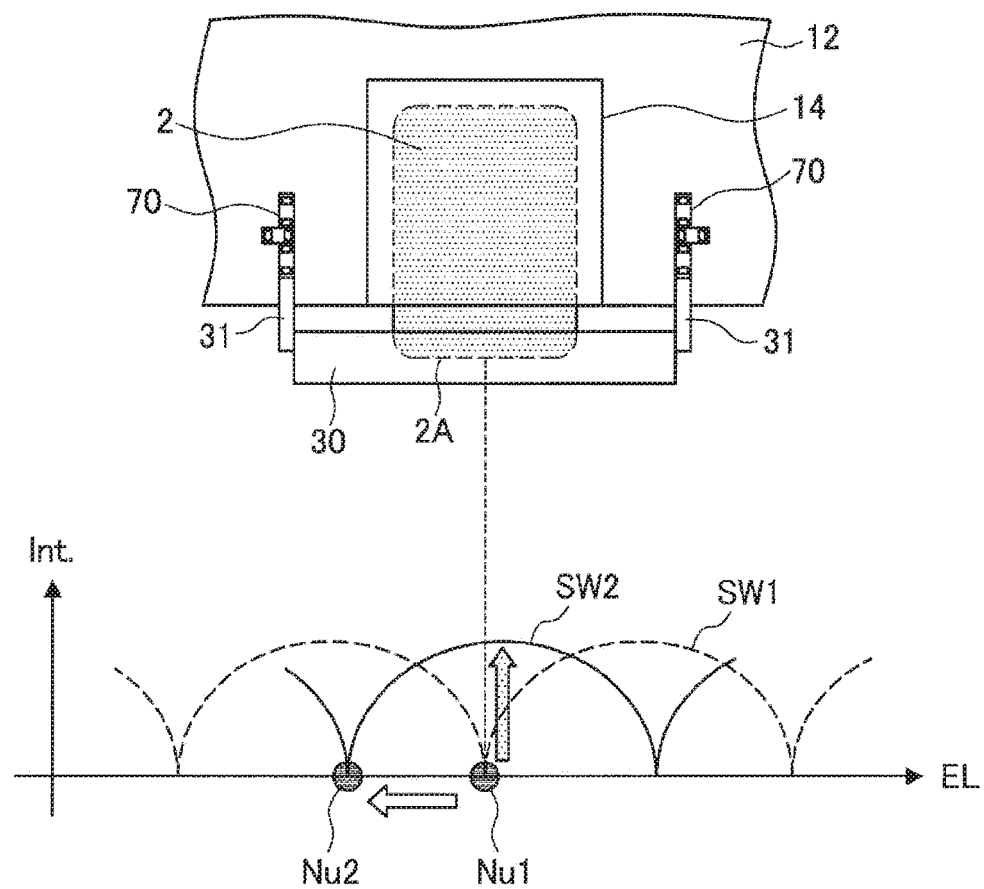
FIG. 32 is a schematic diagram showing an example of a function by an adjustment circuit according to the same embodiment.

FIG. 32 is an outline diagram showing an example of a function by the adjustment circuit according to the present embodiment. As described above, a current may be transmitted from a module such as an antenna to an end portion of the circuit board 12. The current becomes a standing wave by the superposition of a traveling wave and a reflected wave.

At a design stage, a node Nu1 of a standing wave SW1 in a specific band may be adjusted to be a tip 2A of the memory card 2. By this adjustment, isolation is secured between a configuration for the memory card 2 and a configuration for a module or the like. However, a current distribution may be changed by providing the capacitance addition unit 30 and the connection unit 31 according to the embodiment, and a position of a node Nu2 of a standing wave SW2 may be shifted. Then, the intensity of the standing wave may increase at the position of the tip 2A of the memory card 2, and the isolation may not be secured.

Therefore, by providing the adjustment circuit 70 and adjusting the frequency characteristics of the noise propagation circuit including the capacitance addition unit 30 and the connection unit 31, the position of the node of the standing wave can be returned to the position of the node Nu1 again. With this arrangement, even in a case where the capacitance addition unit 30 and the connection unit 31 are provided, it is possible to secure the isolation between the configuration for the memory card 2 and the configuration for the module or the like in the specific band.

Further, by providing the adjustment circuit 70, the frequency characteristic of the noise propagation circuit described above is adjusted. With this arrangement, for example, it is possible to change a frequency band of noise emitted or received at the tip 2A of the memory card 2. With this arrangement, for example, it is also possible to separate a desired antenna reception band and the frequency band of the emitted noise.

4. Summary

The preferred embodiments of the present disclosure have been described in detail with reference to the accompanying drawings. However, the technical scope of the present disclosure is not limited to these examples. It is obvious that those skilled in the art of the present disclosure can perceive various change examples and modifications within the scope of the technical idea described in the claims, and it is naturally understood that these also fall within the technical scope of the present disclosure.

Further, the effects described in the present specification are merely illustrative or exemplary and are not restrictive. That is, the technology according to the present disclosure can achieve other effects apparent to those skilled in the art from the description of the present specification, in addition to or instead of the above effects.

Further, the following configurations fall within the technical scope of the present disclosure.

(1) An electronic component provided in a circuit board having a connector, in which
the connector has a card mounting port and holds a memory card in a state where a tip of the memory card is exposed from the card mounting port at a connection position where a connection terminal of the memory card and a connection terminal of the circuit board are connected, and
the electronic component includes
a capacitance addition unit provided at a position separated from and facing at least a part of the tip of the memory card, in a plan view with respect to at least one surface of the memory card, in a state where the memory card is held at the connection position by the connector, and
a connection unit having first and second end portions in which the first end portion is connected to the capacitance addition unit and the second end portion is connected to a ground of the circuit board.

(2) The electronic component according to (1), in which the capacitance addition unit is provided along the tip of the memory card, in a state where the memory card is held at the connection position by the connector.

(3) The electronic component according to (2), in which the capacitance addition unit has a closed cross-sectional shape surrounding the tip of the memory card in a cross-sectional view orthogonal to an insertion/removal direction of the memory card at the tip of the memory card, in a state where the memory card is held at the connection position by the connector.

(4) The electronic component according to any one of (1) to (3), in which the capacitance addition unit is provided to face a portion of the memory card from the card mounting port to the tip of the memory card, in a state where the memory card is held at the connection position by the connector.

(5) The electronic component according to any one of (1) to (4), in which the capacitance addition unit includes a conductor portion having an opening provided in an insertion/removal direction of the memory card from the card mounting port, in a casing accommodating the circuit board.

(6) The electronic component according to any one of (1) to (4), in which the capacitance addition unit includes a conductor portion disposed along an inner circumferential end face of an opening provided in an insertion/removal direction of the memory card from the card mounting port, in a casing of a dielectric accommodating the circuit board.

(7) The electronic component according to (6) or (7), in which the conductor portion includes a part of an antenna fixed to the casing accommodating the circuit board.

(8) The electronic component according to any one of (1) to (7), in which the capacitance addition unit includes at least one of a dielectric or a magnetic body at the side of the card mounting port in a cross-sectional view orthogonal to an insertion/removal direction of the memory card.

(9) The electronic component according to any one of (1) to (8), in which the capacitance addition unit includes a lid of a conductor at the side where the memory card is exposed from the card mounting port in a state where the memory card is held at the connection position by the connector.

(10) The electronic component according to any one of (1) to (9), in which
a pair of the connection units is connected to the capacitance addition unit, and
the pair of connection units is electrically connected via the capacitance addition unit.

(11) The electronic component according to any one of (1) to (10), in which
a receptacle connected to the ground of the circuit board is disposed in the circuit board, and
the second end portion of the connection unit is removably provided in the receptacle.

(12) The electronic component according to any one of (1) to (11), in which at least a part of the connection unit includes a conductive extendable member.

(13) The electronic component according to any one of (1) to (12), in which the connection unit is connected to the ground of the circuit board via an adjustment circuit including at least one of a distributed constant circuit or a lumped constant circuit, at the side of the second end portion.

REFERENCE SIGNS LIST

1 Portable terminal
2 Memory card
2A Tip
3 Electronic component
10 Casing
12 Circuit board
13 Card controller
14 Connector
14A Card mounting port
17 Antenna
30 Capacitance addition unit
31 Connection unit
32 First end portion
33 Second end portion
70 Adjustment circuit

The invention claimed is:
1. An electronic component provided in a circuit board having a connector, wherein
the connector has a card mounting port and can hold a memory card in a state where a tip of the memory card is exposed from the card mounting port at a connection position where a connection terminal of the memory card and a connection terminal of the circuit board are connected, and
the electronic component comprises
a capacitance addition unit provided at a position separated from and facing at least a part of the tip of the memory card, in a plan view with respect to at least one surface of the memory card, in a state where the memory card is held at the connection position by the connector, and
a connection unit having first and second end portions in which the first end portion is connected to the capacitance addition unit and the second end portion is connected to a ground of the circuit board, wherein the capacitance addition unit is provided along the tip of the memory card, in a state where the memory card is held at the connection position by the connector,
wherein the capacitance addition unit has a closed cross-sectional shape surrounding the tip of the memory card in a cross-sectional view orthogonal to an insertion/removal direction of the memory card at the tip of the memory card, in a state where the memory card is held at the connection position by the connector.

2. The electronic component according to claim 1, wherein the capacitance addition unit is provided to face a portion of the memory card from the card mounting port to the tip of the memory card, in a state where the memory card is held at the connection position by the connector.

3. The electronic component according to claim 1, wherein the capacitance addition unit includes a conductor portion having an opening provided in an insertion/removal direction of the memory card from the card mounting port, in a casing accommodating the circuit board.

4. The electronic component according to claim 1, wherein the capacitance addition unit includes at least one of a dielectric or a magnetic body at the side of the card mounting port in a cross-sectional view orthogonal to an insertion/removal direction of the memory card.

5. The electronic component according to claim 1, wherein the capacitance addition unit includes a lid of a conductor at the side where the memory card is exposed from the card mounting port in a state where the memory card is held at the connection position by the connector.

6. The electronic component according to claim 1, wherein
a pair of the connection units is connected to the capacitance addition unit, and
the pair of connection units is electrically connected via the capacitance addition unit.

7. The electronic component according to claim 1, wherein
a receptacle connected to the ground of the circuit board is disposed in the circuit board, and
the second end portion of the connection unit is removably provided in the receptacle.

8. The electronic component according to claim 1, wherein at least a part of the connection unit includes a conductive extendable member.

9. The electronic component according to claim 1, wherein the connection unit is connected to the ground of the circuit board via an adjustment circuit including at least one of a distributed constant circuit or a lumped constant circuit, at the side of the second end portion.

10. The electronic component according to claim 1, wherein the capacitance addition unit includes a conductor portion disposed along an inner circumferential end face of an opening provided in an insertion/removal direction of the memory card from the card mounting port, in a casing of a dielectric accommodating the circuit board.

11. The electronic component according to claim 10, wherein the conductor portion includes a part of an antenna fixed to the casing accommodating the circuit board.

* * * * *